United States Patent
Segami et al.

(10) Patent No.: US 11,800,257 B2
(45) Date of Patent: Oct. 24, 2023

(54) SOLID-STATE IMAGING ELEMENT, IMAGING DEVICE, AND METHOD FOR CONTROLLING SOLID-STATE IMAGING ELEMENT

(71) Applicant: SONY SEMICONDUCTOR SOLUTIONS CORPORATION, Kanagawa (JP)

(72) Inventors: Masahiro Segami, Kanagawa (JP); Tomonori Yamashita, Kanagawa (JP); Youhei Oosako, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 245 days.

(21) Appl. No.: 17/250,516

(22) PCT Filed: Apr. 26, 2019

(86) PCT No.: PCT/JP2019/017845
§ 371 (c)(1),
(2) Date: Jan. 31, 2021

(87) PCT Pub. No.: WO2020/031439
PCT Pub. Date: Feb. 13, 2020

(65) Prior Publication Data
US 2021/0297622 A1    Sep. 23, 2021

(30) Foreign Application Priority Data
Aug. 7, 2018 (JP) .................. 2018-148292

(51) Int. Cl.
*H04N 25/772* (2023.01)
*H03F 3/34* (2006.01)
*H03M 1/56* (2006.01)

(52) U.S. Cl.
CPC ............. *H04N 25/772* (2023.01); *H03F 3/34* (2013.01); *H03M 1/56* (2013.01)

(58) Field of Classification Search
CPC .... H04N 25/772; H04N 25/75; H04N 25/778; H03F 3/34; H03F 3/45475; H03F 3/45183; H03M 1/56; H03M 1/123
See application file for complete search history.

(56) References Cited

U.S. PATENT DOCUMENTS

| | | | |
|---|---|---|---|
| 10,194,105 B2 * | 1/2019 | Ikuma | .................. H04N 25/67 |
| 2008/0136948 A1 | 6/2008 | Muramatsu | |

(Continued)

FOREIGN PATENT DOCUMENTS

| | | |
|---|---|---|
| CN | 101056364 A | 10/2007 |
| CN | 101924555 A | 12/2010 |

(Continued)

OTHER PUBLICATIONS

International Search Report and Written Opinion of PCT Application No. PCT/JP2019/017845, dated Jul. 23, 2019, 08 pages of ISRWO.

*Primary Examiner* — Michael E Teitelbaum
(74) *Attorney, Agent, or Firm* — CHIP LAW GROUP

(57) ABSTRACT

In a solid-state imaging element in which AD conversion using a reference signal is performed, power consumption of a circuit that generates the reference signal is reduced. A pixel section outputs a pixel signal based on the light amount of incident light. A reference signal supply section generates a first reference signal and a second reference signal. A comparison section includes a first differential pair transistor to which the pixel signal and a signal based on the first reference signal are inputted and a second differential pair (Continued)

transistor to which the second reference signal is inputted. A counter section performs counting on the basis of a signal from the comparison section.

15 Claims, 25 Drawing Sheets

(56) References Cited

U.S. PATENT DOCUMENTS

| | | | |
|---|---|---|---|
| 2010/0315540 A1 | 12/2010 | Hoshino | |
| 2011/0001039 A1 | 1/2011 | Hoshino | |
| 2015/0281603 A1* | 10/2015 | Kim .................... | H04N 25/616 |
| | | | 348/308 |
| 2016/0014353 A1* | 1/2016 | Lee ..................... | H04N 25/583 |
| | | | 250/206 |
| 2017/0302869 A1 | 10/2017 | Ikuma | |

FOREIGN PATENT DOCUMENTS

| | | |
|---|---|---|
| CN | 101939917 A | 1/2011 |
| JP | 11-168383 A | 6/1999 |
| JP | 2007-281987 A | 10/2007 |
| JP | 2009-188815 A | 8/2009 |
| JP | 2009-296423 A | 12/2009 |
| JP | 2010-288218 A | 12/2010 |
| KR | 10-2007-0101159 A | 10/2007 |
| KR | 10-2010-0093568 A | 8/2010 |
| KR | 10-2010-0134518 A | 12/2010 |

* cited by examiner

SOLID-STATE IMAGING ELEMENT, IMAGING DEVICE, AND METHOD FOR CONTROLLING SOLID-STATE IMAGING ELEMENT

CROSS REFERENCE TO RELATED APPLICATIONS

This application is a U.S. National Phase of International Patent Application No. PCT/JP2019/017845 filed on Apr. 26, 2019, which claims priority benefit of Japanese Patent Application No. JP 2018-148292 filed in the Japan Patent Office on Aug. 7, 2018. Each of the above-referenced applications is hereby incorporated herein by reference in its entirety.

TECHNICAL FIELD

The present technology relates to a solid-state imaging element, an imaging device, and a method for controlling the solid-state imaging element. Specifically, the present technology relates to a solid-state imaging element and an imaging device in which a comparator and a counter are used to convert an analog signal to a digital signal, and a method for controlling the solid-state imaging element.

BACKGROUND ART

In the past, in solid-state imaging elements, single-slope analog to digital converters (ADC) have been used widely because these converters have simple structures. A single-slope ADC includes a comparator and a counter. The comparator compares an input signal to be converted, with a predetermined reference signal. In addition, the counter of the ADC counts a count value until a comparison result from the comparator is inverted and outputs a digital signal indicating the count value. As the reference signal, a lamp signal or the like is used. When the amplitude of the lamp signal is larger, the full scale of an input signal corresponding to a digital signal range, which is determined by the resolution specification of the ADC, is larger. For example, a solid-state imaging element in which ADCs are disposed for respective columns and a DAC (Digital to Analog Converter) generates single end signals as reference signals and supplies the reference signals to the ADCs is proposed (for example, see PTL 1).

CITATION LIST

Patent Literature

[PTL 1]
JP 2009-296423A

SUMMARY

Technical Problems

In the abovementioned existing technology, AD conversion of analog signals of one column can be performed at one time by the corresponding ADC disposed for the column. However, it is difficult to reduce power consumption of the DAC for generating the reference signals. For example, to reduce the power consumption of the DAC, the amplitude of a reference signal may be set to be small to set the maximum value of the output voltage of the DAC to be also small so that the voltage of a power source is lowered. However, in this case, the amount of increased power consumption to maintain the ratio (PSNR: Peak Signal-to-Noise Ratio) of the full scale of a reference signal outputted from the DAC and a noise effective value cancels the reduced amount of the voltage of the power source.

The present technology has been made in view of the above circumstances, and an object thereof is to reduce power consumption of a circuit that generates a reference signal in a solid-state imaging element in which AD conversion using the reference signal is performed.

Solution to Problems

The present technology has been made in order to solve the above problems. A first aspect of the present technology is a solid-state imaging element and a method for controlling the same. The solid-state imaging element includes a pixel section that outputs a pixel signal based on a light amount of incident light, a reference signal supply section that generates a first reference signal and a second reference signal, a comparison section that includes a first differential pair transistor to which the pixel signal and a signal based on the first reference signal are inputted and a second differential pair transistor to which the second reference signal is inputted, and a counter section that performs counting on the basis of a signal from the comparison section. Accordingly, an effect that the comparison result is generated from the first and second reference signals and the input signal is provided.

Further, in the first aspect, the comparison section may further include an input-side voltage division circuit that supplies, as a comparison target signal, a signal obtained by dividing a voltage difference between the first reference signal and the pixel signal to the first differential pair transistor, and a differential amplifier including the first and second differential pair transistors may amplify a difference between the comparison target signal and the second reference signal and output the resultant signal as the comparison result to the counter section. Accordingly, an effect that a signal obtained by dividing the voltage difference between the first reference signal and the pixel signal is compared with the second reference signal is provided.

Further, in the first aspect, the comparison section may further include a reference-side voltage division circuit that supplies a signal obtained by dividing a voltage difference between the second reference signal and a predetermined fixed potential to the second differential pair transistor, and the differential amplifier may amplify a difference between the comparison target signal and the signal obtained by voltage division at the reference-side voltage division circuit. Accordingly, an effect that the first and second reference signals with high symmetry of the differential properties are supplied is provided.

Further, in the first aspect, the comparison section may further include an output amplifier that amplifies the comparison result and outputs the result to the counter. Accordingly, an effect that a circuit posterior to the counter is driven by the amplified signal is provided.

Further, in the first aspect, the comparison section may further include an amplitude restricting section that restricts an amplitude of the comparison result and supplies the result to the output amplifier. Accordingly, an effect that the amplitude of the comparison result is restricted is provided.

Further, in the first aspect, the amplitude restricting section may include a pair of bias voltage supply sections that supplies bias voltages different from each other and a pair of diodes that are interposed in series between the pair of bias voltage supply sections. An output terminal of the differential amplifier and an input terminal of the output amplifier may be connected in common to a connection point between the pair of diodes. Accordingly, an effect that the amplitude is restricted to the range of the upper limit value to the lower limit value is provided.

Further, in the first aspect, the amplitude restricting section may include a P-type transistor and an N-type transistor that are connected in series and a pair of bias voltage supply sections that supply bias voltages different from each other to respective gates of the P-type transistor and the N-type transistor, and an output terminal of the differential amplifier and an input terminal of the output amplifier may be connected in common to a connection point between the P-type transistor and the N-type transistor. Accordingly, an effect that the amplitude is restricted to the range of the upper limit value to the lower limit value is provided.

Further, in the first aspect, the amplitude restricting section may include a power source-side current source that is connected to a power source terminal, a gate-grounded transistor having a source one end of which is connected to the power source-side current source and a drain one end of which is connected to the power source-side current source, a bias voltage supply section that supplies a predetermined bias voltage to a gate of the gate-grounded transistor, and a ground-side current source that is interposed between a ground terminal and other ends of the source and the drain of the gate-grounded transistor. A connection point between either one of the power source-side current source and the ground-side current source and the source of the gate-grounded transistor may be connected to the output terminal of the differential amplifier, and a connection point between the other one of the power source-side current source and the ground-side current source and the drain of the gate-grounded transistor may be connected to the input terminal of the output amplifier. Accordingly, an effect that the amplitude is restricted to the range that is greater than the lower limit value is provided.

Further, in the first aspect, the amplitude restricting section may further include an input-side switch that opens/closes a path between the output terminal of the differential amplifier and the connection point between either one of the power source-side current source and the ground-side current source and the source of the gate-grounded transistor; and an output-side switch that opens/closes a path between the ground terminal and the connection point between the other one of the power source-side current source and the ground-side current source and the drain of the gate-grounded transistor. In a case where one of the input-side switch and the output-side switch enters an open state, the other switch may be shifted to a closed state. Accordingly, an effect that an output from the differential amplifier is interrupted during an auto-zero operation is provided.

Further, in the first aspect, the reference signal supply section may include plural selection circuits from each of which a predetermined current is outputted from either one of first and second output terminals according to a predetermined selection signal, a first resistor having one end connected in common to the respective first output terminals of the plurality of selection circuits, and a second resistor having one end connected in common to the respective second output terminals of the plurality of selection circuits. The first reference signal may be outputted from the one end of the first resistor, and the second reference signal may be outputted from the one end of the second resistor. Accordingly, an effect that the first and second reference signals are generated according to the selection signal is provided.

Further, in the first aspect, the selection circuits may each include a current source that supplies the predetermined current, first and second selection transistors that are connected in common to the current source, an inverter that inverts the selection signal and supplies the inverted selection signal to a gate of either one of the first and second selection transistors, a first cascode transistor that is interposed in series between the first selection transistor and the first output terminal, and a second cascode transistor that is interposed in series between the second selection transistor and the second output terminal. The selection signal may be inputted to a gate of the other one of the first and second selection transistors, and a predetermined bias voltage may be applied to respective gates of the first and second cascode transistors. Accordingly, an effect that the output accuracy of the DAC is improved is provided.

Further, the first aspect may further include a pixel that generates the input signal by photoelectric conversion. The pixel may be disposed on a predetermined light receiving board, and the reference signal supply section, the comparison section, and the counter section may be disposed on a predetermined circuit board that is layered on the light receiving board. Accordingly, an effect that a circuit scale per board can be reduced is provided.

In addition, a second aspect of the present technology is an imaging device including a pixel section that outputs a pixel signal based on a light amount of incident light, a reference signal supply section that generates a first reference signal and a second reference signal, a comparison section that includes a first differential pair transistor to which the pixel signal and a signal based on the first reference signal are inputted and a second differential pair transistor to which the second reference signal is inputted, a counter section that performs counting on the basis of a signal from the comparison section, and a signal processing section that processes a digital signal indicating a count value of the counter. Accordingly, an effect that the comparison result is generated from the first and second reference signals and the input signal and the digital signal generated from the comparison result is processed, is provided.

Advantageous Effect of Invention

The present technology can provide an excellent effect that, in a solid-state imaging element in which AD conversion using a reference signal is performed, power consumption of a circuit that generates the reference signal can be reduced. It is to be noted that the effect disclosed above is not necessarily limitative, and it is sufficient that any one of effects disclosed in the present disclosure is provided.

DESCRIPTION OF EMBODIMENTS

Hereinafter, an explanation will be given of modes for carrying out the present technology (hereinafter, referred to as embodiments). The explanation will be given in the following order.

1. First Embodiment (Embodiment of supplying a pair of reference signals to a comparator)
2. Second Embodiment (Embodiment of supplying a pair of reference signals to a comparator in a layered structure)
3. Third Embodiment (Embodiment of supplying a pair of reference signals to a comparator and disposing two-stage amplifiers in a comparator)
4. Fourth Embodiment (Embodiment of supplying a pair of reference signals to a comparator and restricting an amplitude of a comparison result)
5. Fifth Embodiment (Embodiment of supplying a pair of reference signals to a comparator and adding a cascode transistor to a DAC)
6. Sixth Embodiment (Embodiment of supplying a pair of reference signals with high symmetry of differential properties to a comparator)
7. Examples of Application to Mobile Body

1. First Embodiment

[Configuration Example of Imaging Device]

Figure 1:
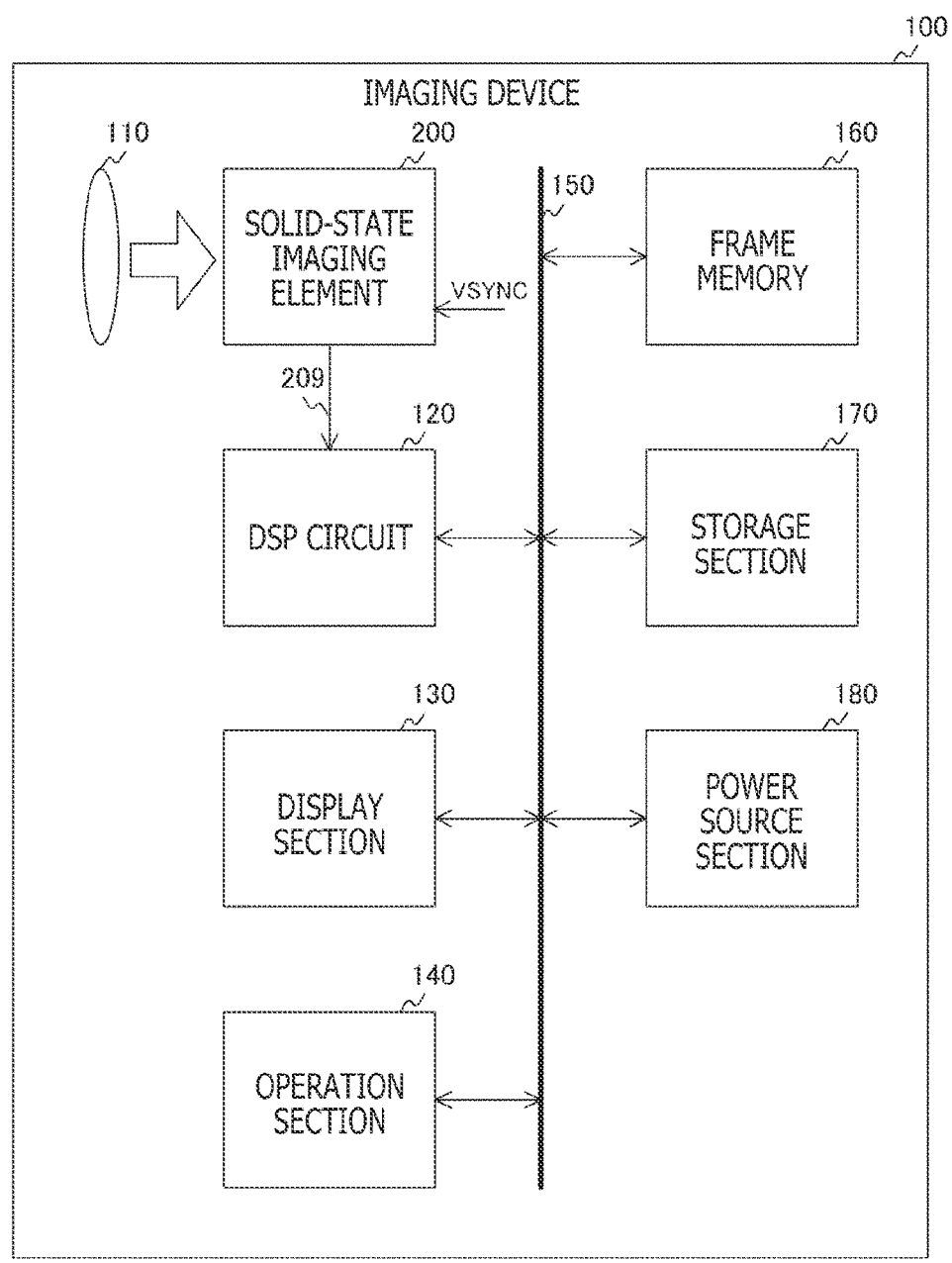
FIG. 1 is a block diagram depicting one configuration example of an imaging device according to a first embodiment of the present technology.

FIG. 1 is a block diagram depicting one example of an imaging device 100 according to a first embodiment of the present technology. The imaging device 100 is for performing imaging to obtain image data and includes an optical section 110, a solid-state imaging element 200, and a DSP (Digital Signal Processing) circuit 120. Further, the imaging device 100 includes a display section 130, an operation section 140, a bus 150, a frame memory 160, a storage section 170, and a power source section 180. It is assumed that a camera to be installed on an industrial robot, an on-vehicle camera, or the like is used as the imaging device 100.

The optical section 110 is configured to collect light from a subject and guide the light to the solid-state imaging element 200. The solid-state imaging element 200 is configured to generate image data by photoelectric conversion. The solid-state imaging element 200 generates image data and supplies the image data to the DSP circuit 120 via a signal line 209.

The DSP circuit 120 is configured to perform predetermined signal processing on the image data. The DSP circuit 120 outputs the processed image data to the frame memory 160, etc., via the bus 150. It is to be noted that the DSP circuit 120 is one example of the signal processing section set forth in the claims.

The display section 130 is configured to display the image data. It is assumed that a liquid crystal panel or an organic EL (Electro Luminescence) panel is used as the display section 130, for example. The operation section 140 is configured to generate an operation signal in accordance with a user operation.

The bus 150 is a common path for data exchange among the optical section 110, the solid-state imaging element 200, the DSP circuit 120, the display section 130, the operation section 140, the frame memory 160, the storage section 170, and the power source section 180.

The frame memory 160 is configured to hold the image data. The storage section 170 is configured to store various kinds of data including the image data. The power source section 180 is configured to supply power to the solid-state imaging element 200, the DSP circuit 120, and the display section 130, etc.

[Configuration Example of Solid-State Imaging Element]

Figure 2:
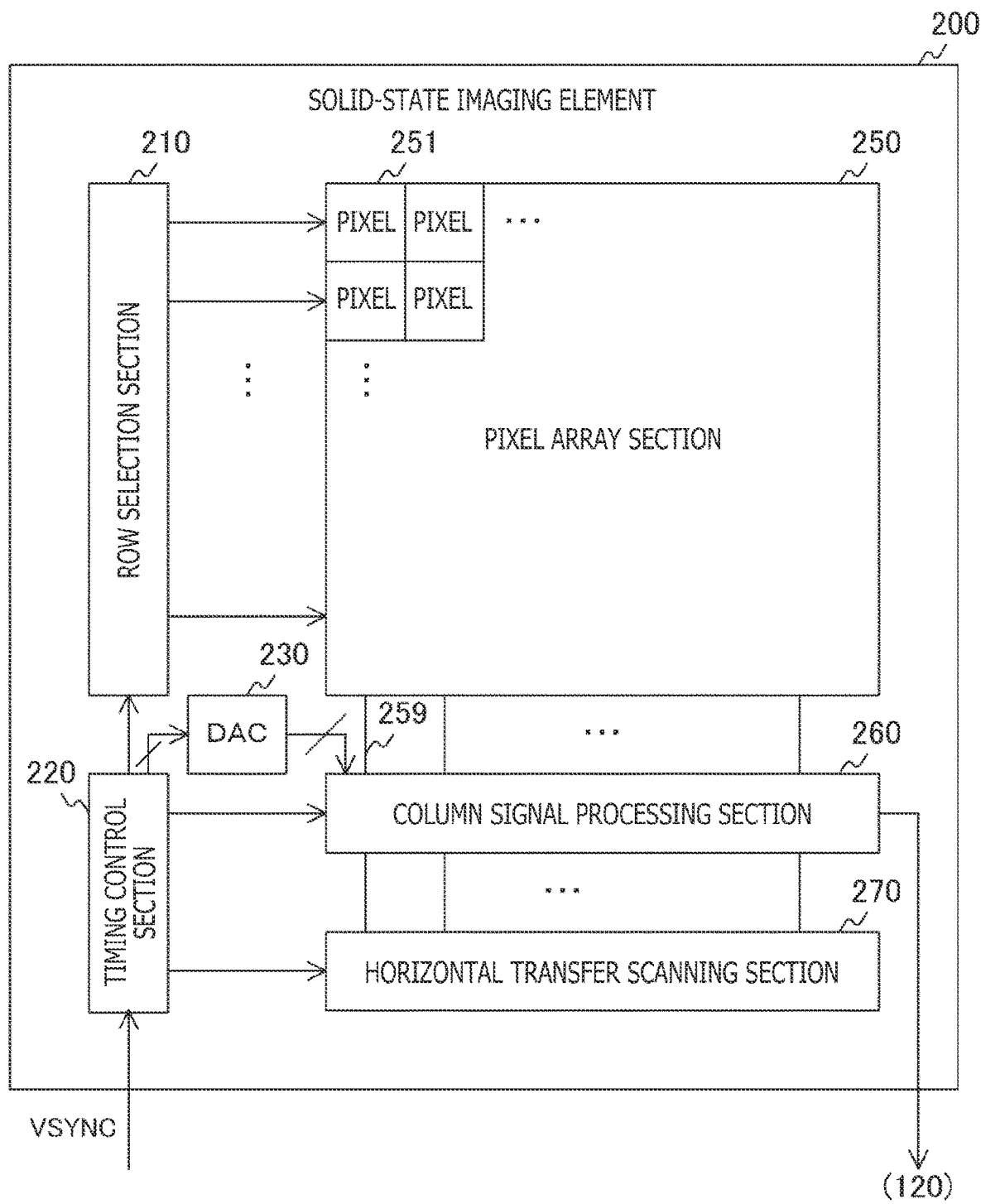
FIG. 2 is a block diagram depicting one configuration example of a solid-state imaging element according to the first embodiment of the present technology.

FIG. 2 is a block diagram depicting one configuration example of the solid-state imaging element 200 according to the first embodiment of the present technology. The solid-state imaging element 200 includes a row selection section 210, a timing control section 220, a DAC 230, a pixel array section 250, a column signal processing section 260, and a horizontal transfer scanning section 270. These circuits are disposed on a single semiconductor board. In the pixel array section 250, a plurality of pixels 251 is arranged in a two-dimensional lattice-like shape. Hereinafter, a set of pixels 251 arranged in a horizontal direction is referred to as a "row," and a set of pixels 251 arranged in a vertical direction is referred to as a "column." Further, in the pixel array section 250, vertical signal lines 259 are arranged for the respective columns. It is to be noted that the pixel array section 250 is one example of the pixel section set forth in the claims.

The timing control section 220 is configured to control respective operation timings of the row selection section 210, the DAC 230, the column signal processing section 260, and the horizontal transfer scanning section 270 in synchronization with a vertical synchronization signal VSYNC.

The row selection section 210 is configured to sequentially select and drive the rows in the pixel array section 250 such that the pixel array section 250 outputs pixel signals. The pixels 251 of the selected row each output analog signals to the column signal processing section 260 via the corresponding vertical signal lines 259.

The DAC 230 is configured to generate, as a pair of reference signals, a pair of differential signals that fluctuate with lapse of time. For example, lamp signals are generated as the reference signals. The DAC 230 supplies the generated pair of reference signals to the column signal processing section 260. It is to be noted that the DAC 230 is one example of the reference signal supply section set forth in the claims.

The column signal processing section 260 is configured to perform processing, such as AD conversion or CDS (Correlated Double Sampling), on pixel signals of each column. The column signal processing section 260 supplies image data including the processed digital signals, to the DSP circuit 120.

The horizontal transfer scanning section 270 is configured to sequentially select the columns and output digital signals of a selected column through the column signal processing section 260.

[Configuration Example of Column Signal Processing Section]

Figure 3:
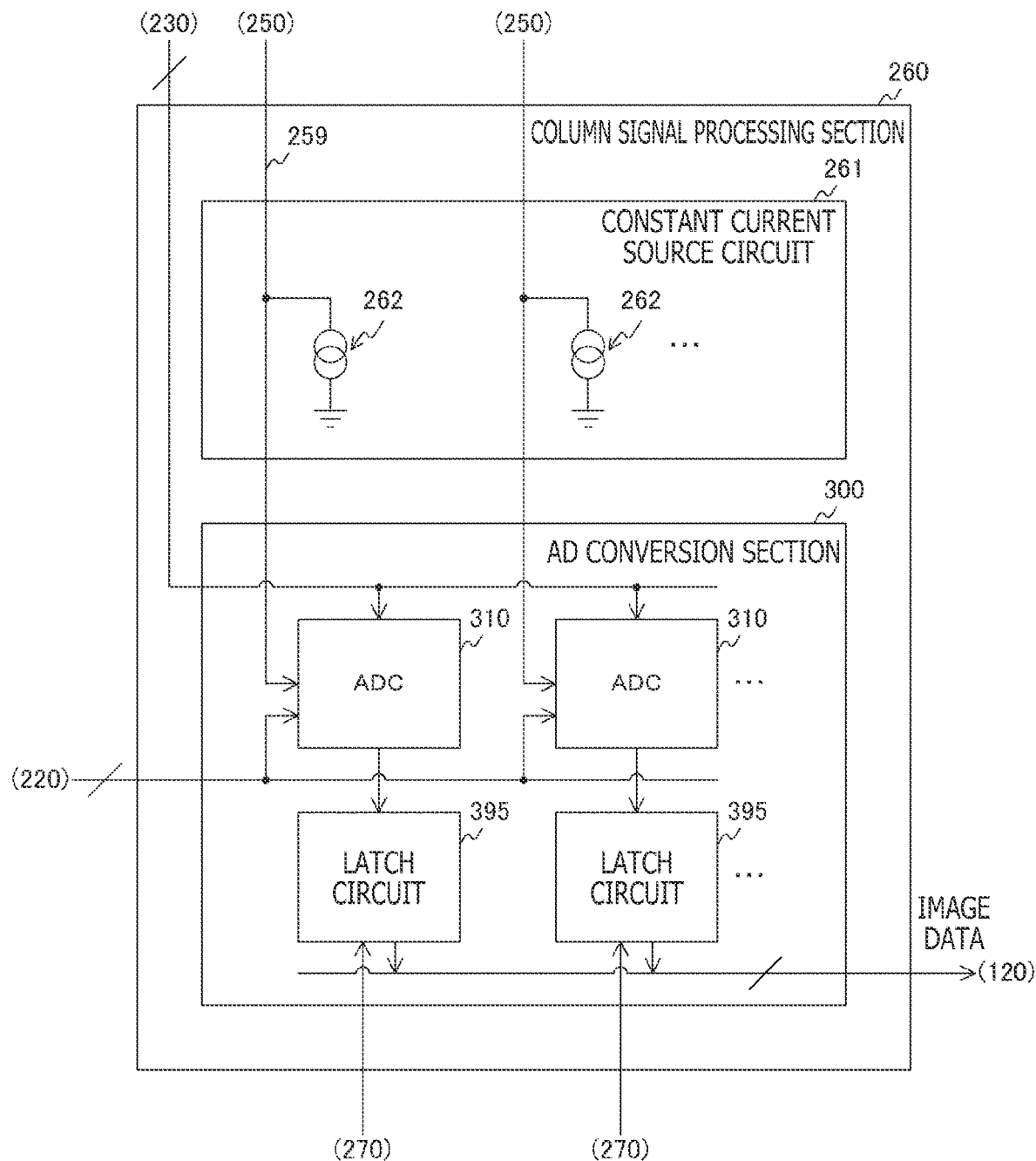
FIG. 3 is a block diagram depicting one configuration example of a column signal processing section according to the first embodiment of the present technology.

FIG. 3 is a block diagram depicting one configuration example of the column signal processing section 260 according to the first embodiment of the present technology. The column signal processing section 260 includes a constant current source circuit 261 and an AD conversion section 300.

In the constant current source circuit 261, constant current sources 262 are disposed for the respective columns. The respective constant current sources 262 are connected to the vertical signal lines 259 of the corresponding columns.

A set of an ADC 310 and a latch circuit 395 is disposed for each column in the AD conversion section 300.

The ADC 310 is configured to convert pixel signals inputted via the vertical signal line 259 of the corresponding column, to digital signals. The ADC 310 outputs the converted digital signals to the latch circuit 395.

The latch circuit 395 is configured to hold the digital signals of the corresponding column. The latch circuit 395 outputs the held digital signal to the DSP circuit 120 under the control of the horizontal transfer scanning section 270.

[Configuration Example of ADC]

Figure 4:
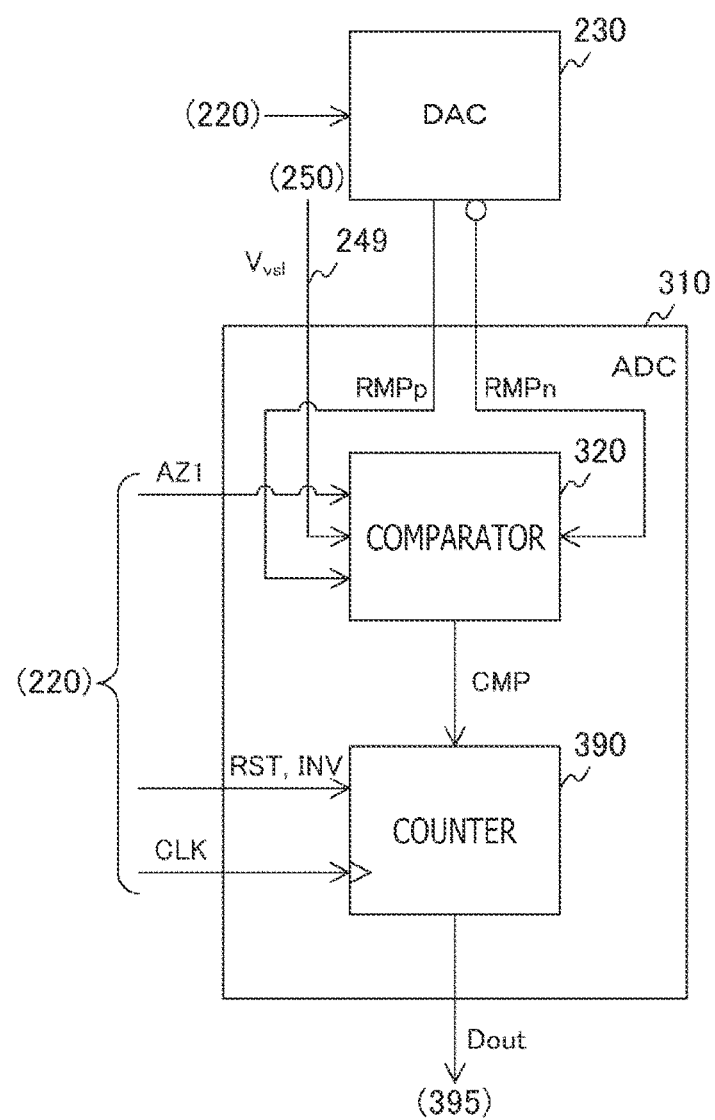
FIG. 4 is a block diagram depicting one configuration example of a DAC and an ADC according to the first embodiment of the present technology.

FIG. 4 is a block diagram depicting one configuration example of the DAC 230 and the ADC 310 according to the first embodiment of the present technology. The ADC 310 includes a comparator 320 and a counter 390.

The DAC 230 outputs, between a pair of differential signals, a positive-side signal as a reference signal RMPp and a negative-side signal as a reference signal RMPn. As these reference signals, lamp signals are used, for example.

The comparator 320 is configured to compare a comparison target signal corresponding to the value of a pixel signal $V_{vs1}$ with respect to the reference signal RMPp, with the reference signal RMPn. For example, the comparator 320 generates, as a comparison target signal, a signal obtained by dividing the voltage difference between the reference signal RMPp and the pixel signal $V_{vs1}$, and compares the comparison target signal with the reference signal RMPn. Then, the comparator 320 supplies a comparison result CMP to the counter 390. It is to be noted that a circuit constituting the comparator 320 is one example of the comparison section set forth in the claims.

The counter 390 is configured to count a count value in synchronization with a clock signal CLK from the timing control section 220 over a period until the comparison result CMP is inverted. Here, before exposure is ended, the row selection section 210 initializes each of the potentials of pixel signals $V_{vs1}$ outputted from the pixels 251 of a selected row, to a reset level. In addition, after exposure is ended, the row selection section 210 causes the pixels 251 to output the pixel signals $V_{vs1}$ corresponding to the exposure amounts. The potential of a pixel signal $V_{vs1}$ at this time is called a signal level. It is to be noted that a circuit constituting the counter 390 is one example of the counter section set forth in the claims.

The timing control section 220 causes the counter 390 to initialize the count value by using a reset signal RST before the reset level is outputted. The counter 390 counts down the count value in synchronization with the clock signal CLK over a period until the comparison result CMP is inverted. Accordingly, AD conversion of the reset level is performed.

Then, the timing control section 220 inverts the polarity of an increase amount by using an inversion signal INV immediately before the signal level is outputted. The counter 390 counts up the count value in synchronization with the clock signal CLK over a period until the comparison result CMP is inverted. Accordingly, AD conversion of the signal level is performed. Further, when counting is ended, the count value represents the difference between the reset level and the signal level. Through the procedures explained so far, AD conversion and CDS processing are executed. The counter 390 outputs a digital signal Dout indicating the count value to the latch circuit 395.

It is to be noted that the counter 390 performs down counting when the reset level is converted, and performs up counting when the signal level is converted, but the counter 390 is not limited to this configuration. For example, the counter 390 may perform up counting when the reset level is converted, and may perform down counting when the signal level is converted.

Further, one DAC 230 is configured to generate both the reference signals RMPp and RMPn, but a pair of DACs may be disposed such that one of the DACs generates the reference signal RMPp while the other DAC generates the reference signal RMPn.

[Configuration Example of Comparator]

Figure 5:
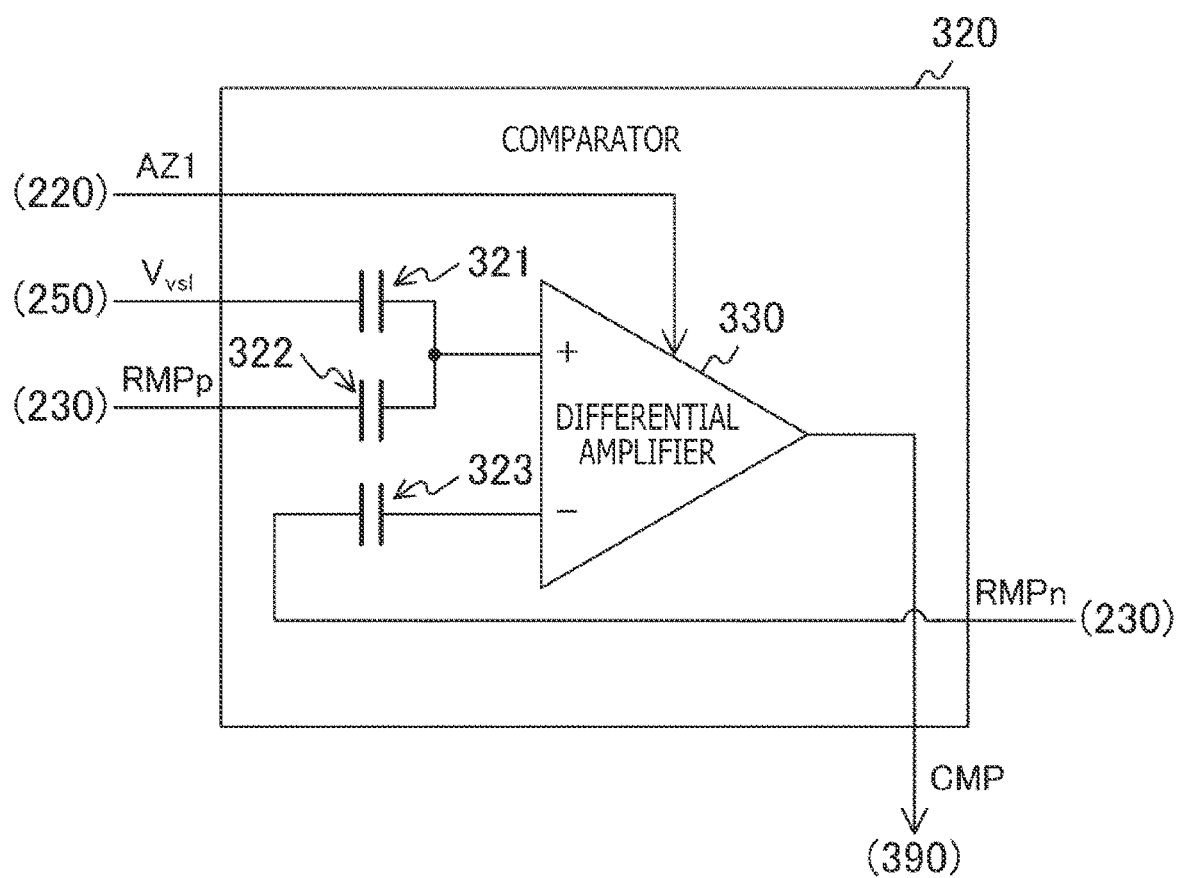
FIG. 5 is a circuit diagram depicting one configuration example of a comparator according to the first embodiment of the present technology.

FIG. 5 is a circuit diagram depicting one configuration example of the comparator 320 according to the first embodiment of the present technology. The comparator 320 includes capacitors 321, 322, and 323, and a differential amplifier 330.

The capacitor 321 has one end to which the pixel signal $V_{vs1}$ is inputted and the other end connected to a non-inverted input terminal (+) of the differential amplifier 330. The capacitor 322 has one end to which the reference signal RMPp is inputted and the other end connected, together with the capacitor 321, to the non-inverted input terminal (+) of the differential amplifier 330. As a result of this connection configuration, a signal obtained by dividing the voltage difference between the inputted pixel signal $V_{vs1}$ and the reference signal RMPp is inputted to the non-inverted input terminal (+) of the differential amplifier 330. It is to be noted that a circuit including the capacitors 321 and 322 is one example of the input-side voltage division circuit set forth in the claims.

In addition, the capacitor 323 has one end to which the reference signal RMPn is inputted and the other end connected to a non-inverted input terminal (−) of the differential amplifier 330.

The differential amplifier 330 is configured to amplify the difference between a signal inputted to the non-inverted input terminal (+) and a signal inputted to the inverted input terminal (−). The differential amplifier 330 outputs the amplified signal as the comparison result CMP to the counter 390. Further, an auto-zero signal AZ1 from the timing control section 220 is inputted to the differential amplifier 330.

Here, a comparative example in which the DAC 230 supplies a single end signal as a reference signal to the capacitor 322 is assumed. When a full scale is fixed, power consumption of the DAC 230 in this comparative example is large, compared to a configuration in which the DAC 230 supplies a pair of differential signals. The reason for this will be explained later.

It is to be noted that the reference signal RMPp and the reference signal RMPn are inputted to one end of the capacitor 322 and one end of the capacitor 323, respectively, but the configuration is not limited to this. For example, the reference signal RMPn may be inputted to one end of the capacitor 322, and the reference signal RMPp may be inputted to one end of the capacitor 323.

Figure 6:
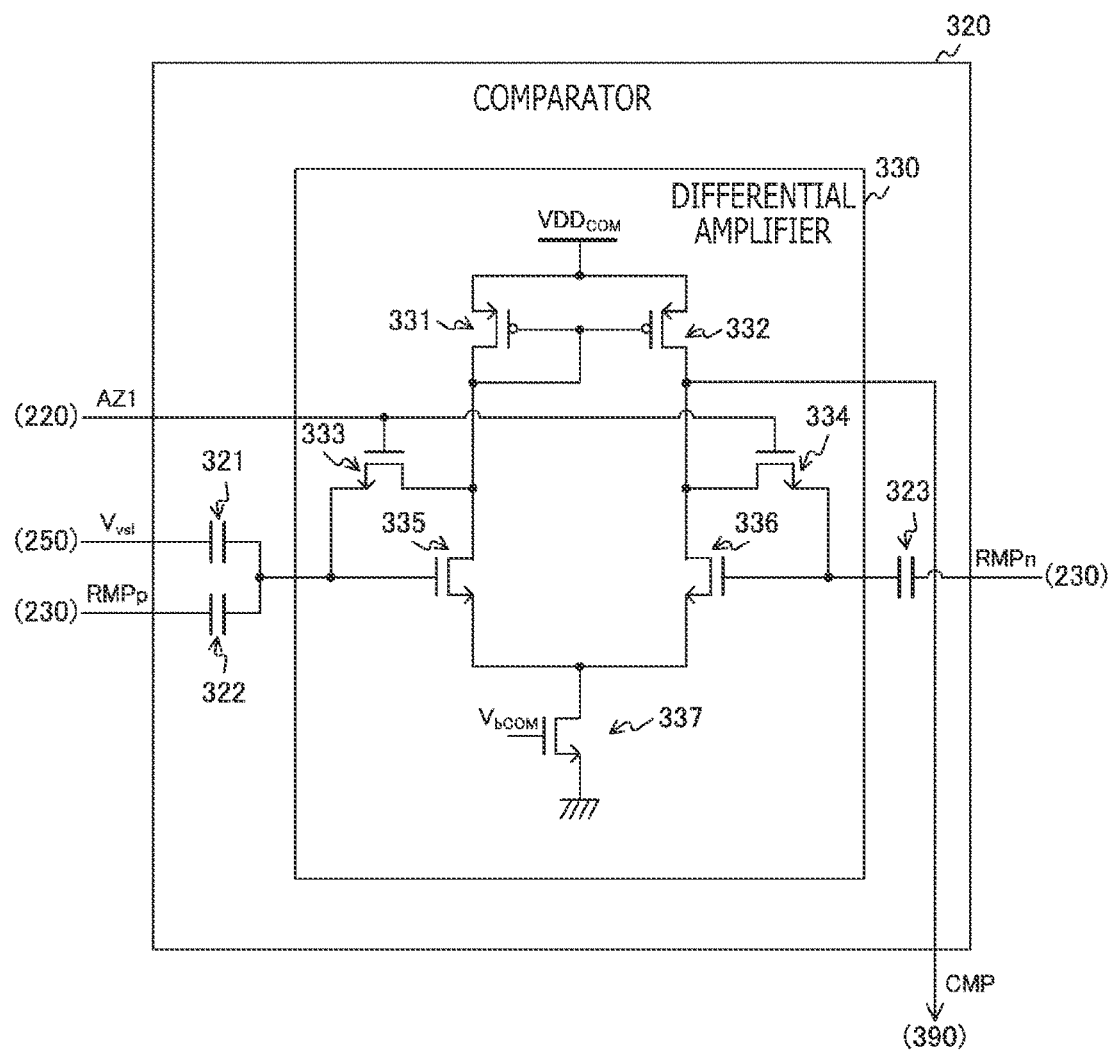
FIG. 6 is a circuit diagram depicting one configuration example of a differential amplifier according to the first embodiment of the present technology.

FIG. 6 is a circuit diagram depicting one configuration example of the differential amplifier 330 according to the first embodiment of the present technology. The differential amplifier 330 includes P-type transistors 331 and 332, N-type transistors 333 to 336, and a current source transistor 337. As these transistors, MOS (Metal-Oxide-Semiconductor) transistors are used, for example. As the current source transistor 337, an N-type MOS transistor is used, for example.

The sources of the P-type transistors 331 and 332 are connected in common to a power source terminal of a power source potential $VDD_{COM}$. Further, the gate of the P-type transistor 331 is connected to the drain of the P-type transistor 331 itself and the gate of the P-type transistor 332.

The drain of the N-type transistor 335 is connected to the drain of the P-type transistor 331, the gate of the N-type transistor 335 is connected to the connection point between the capacitors 321 and 322, and the source of the N-type transistor 335 is connected to the drain of the current source transistor 337. The drain of the N-type transistor 336 is connected to the drain of the P-type transistor 332, the gate of the N-type transistor 336 is connected to the capacitor 323, and the source of the N-type transistor 336 is connected to the drain of the current source transistor 337. In addition, the comparison result CMP is outputted from the connection point between the P-type transistor 332 and the N-type transistor 336. It is to be noted that the P-type transistor 332 is one example of the first differential pair transistor set forth in the claims and that the N-type transistor 336 is one example of the second differential pair transistor set forth in the claims.

A constant bias voltage $V_{bCOM}$ is applied to the gate of the current source transistor 337, and the source of the current source transistor 337 is connected to a ground terminal. The current source transistor 337 functions as a tail current source.

The N-type transistor 333 short-circuits the gate and the drain of the N-type transistor 335 according to the auto-zero signal AZ1. The N-type transistor 334 short-circuits the gate and the drain of the N-type transistor 336 according to the auto-zero signal AZ1. With these transistors, an auto-zero operation is implemented.

With the abovementioned configuration, a signal obtained by amplifying the difference between signals inputted to the respective gates of the N-type transistor 335 and the N-type transistor 336 is generated as the comparison result CMP.

Figure 7:
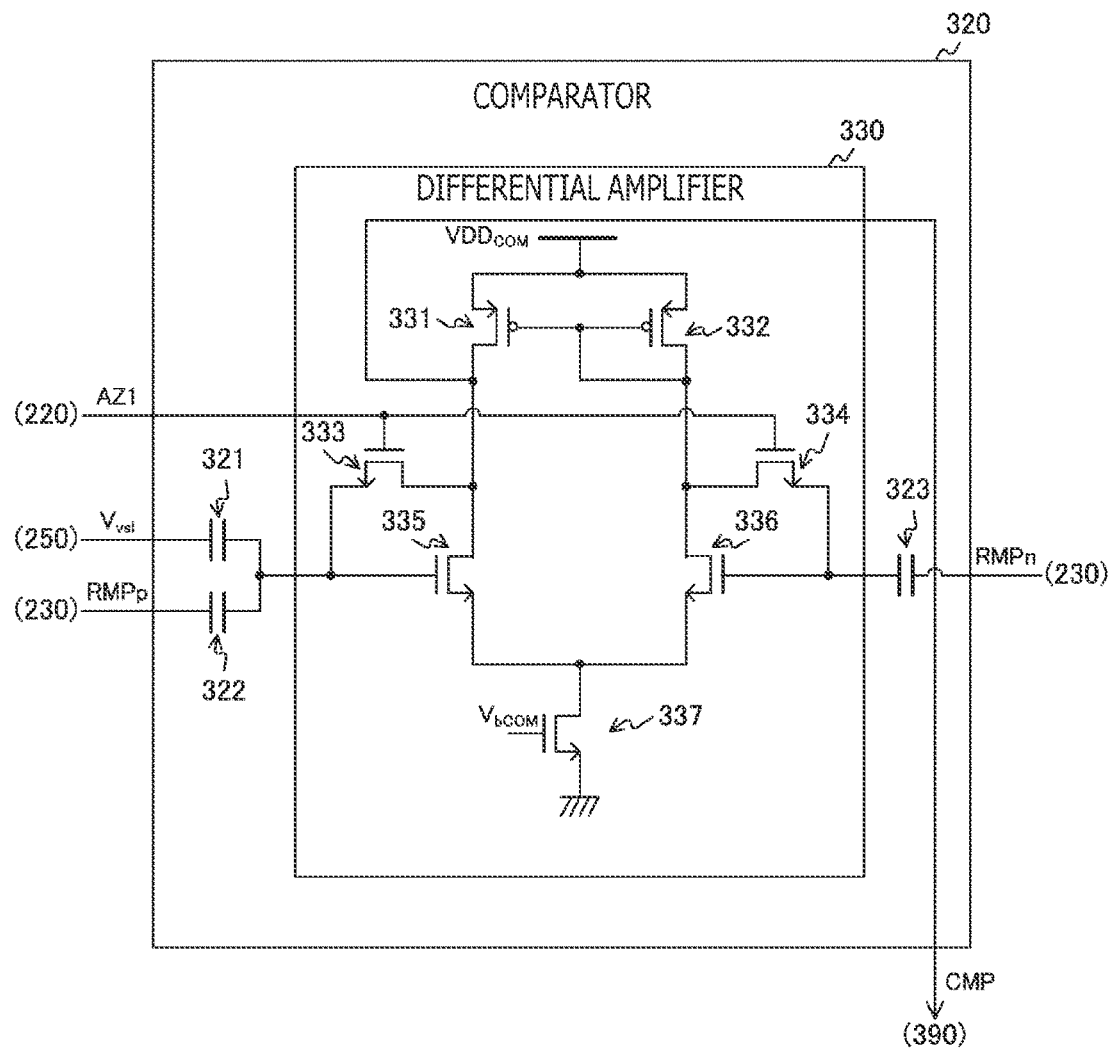
FIG. 7 is a circuit diagram depicting one configuration example of the differential amplifier obtained by changing connection according to the first embodiment of the present technology.

It is to be noted that the differential amplifier 330 is configured to output, as the comparison result CMP, a signal of the connection point between the P-type transistor 332 and the N-type transistor 336, but is not limited to this configuration. As illustrated in FIG. 7, the differential amplifier 330 may output, as the comparison result CMP, the connection point between the P-type transistor 331 and the N-type transistor 335. In this case, it is sufficient that the gate and the drain of the P-type transistor 331 are not connected, but the gate of the P-type transistor 332 is connected to the gate of the P-type transistor 332 and the gate of the P-type transistor 331.

Figure 8:
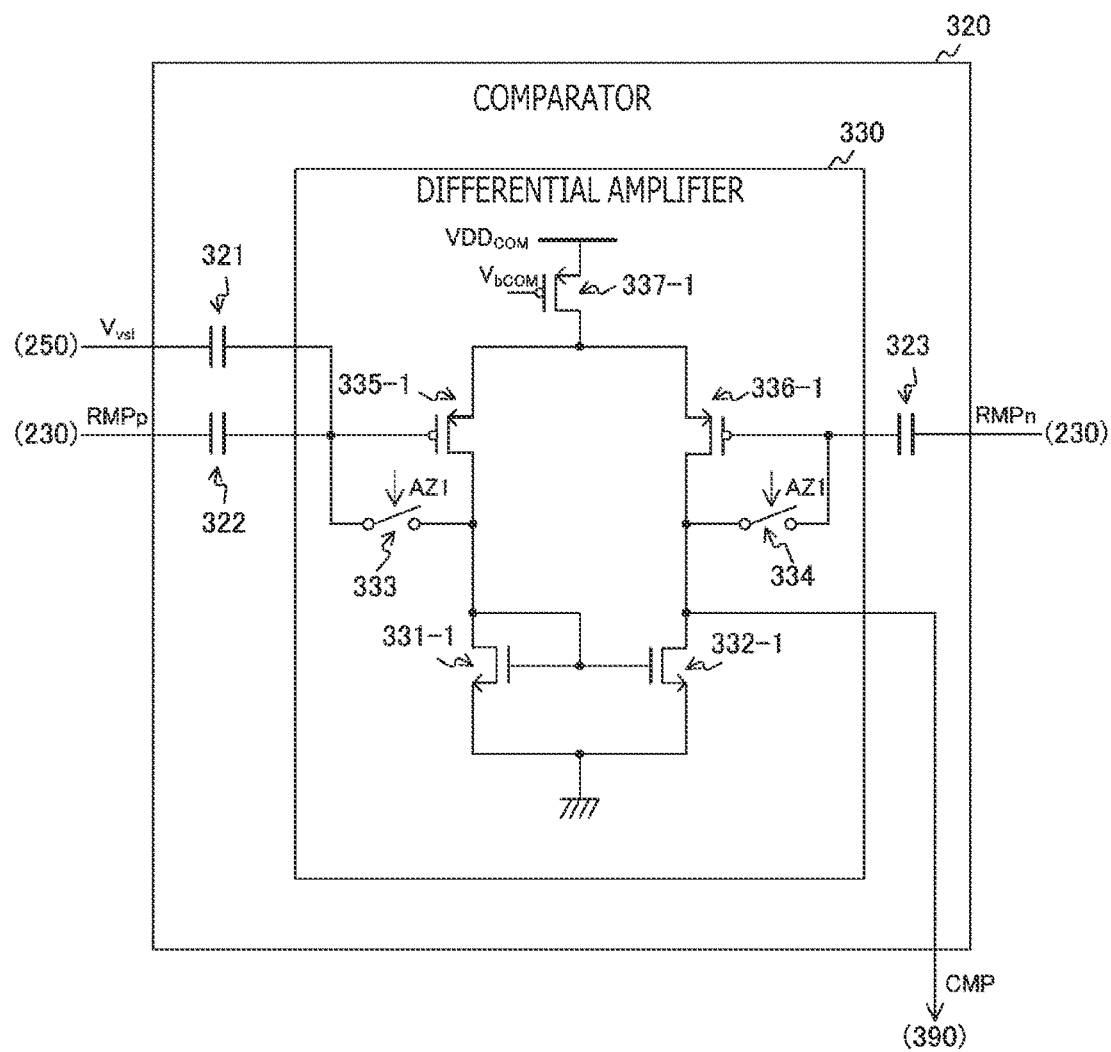
FIG. 8 is a circuit diagram depicting one configuration example of the differential amplifier obtained by changing polarities of transistors according to the first embodiment of the present technology.

In addition, the configuration of the differential amplifier 330 is not limited to the circuit illustrated in FIG. 6 or FIG. 7 as long as the difference between the input terminals can be amplified. For example, as illustrated in FIG. 8, P-type transistors 335-1 and 336-2 may be disposed in place of the N-type transistors 335 and 336. In this case, N-type transistors 331-1 and 332-2 are disposed in place of the P-type transistors 331 and 332, and a P-type current source transistor 337-1 is disposed in place of the N-type current source transistor 337. In this configuration, it is sufficient that the current source transistor 337-1 is disposed on the power source side and that the N-type transistors 331-1 and 332-2 are disposed on the ground side. It is to be noted that the N-type transistors 333 and 334 are used as switches to be controlled during an auto-zero operation in FIGS. 6 to 8, but P-type transistors may be used in place of these N-type transistors.

[Configuration Example of DAC]

Figure 9:
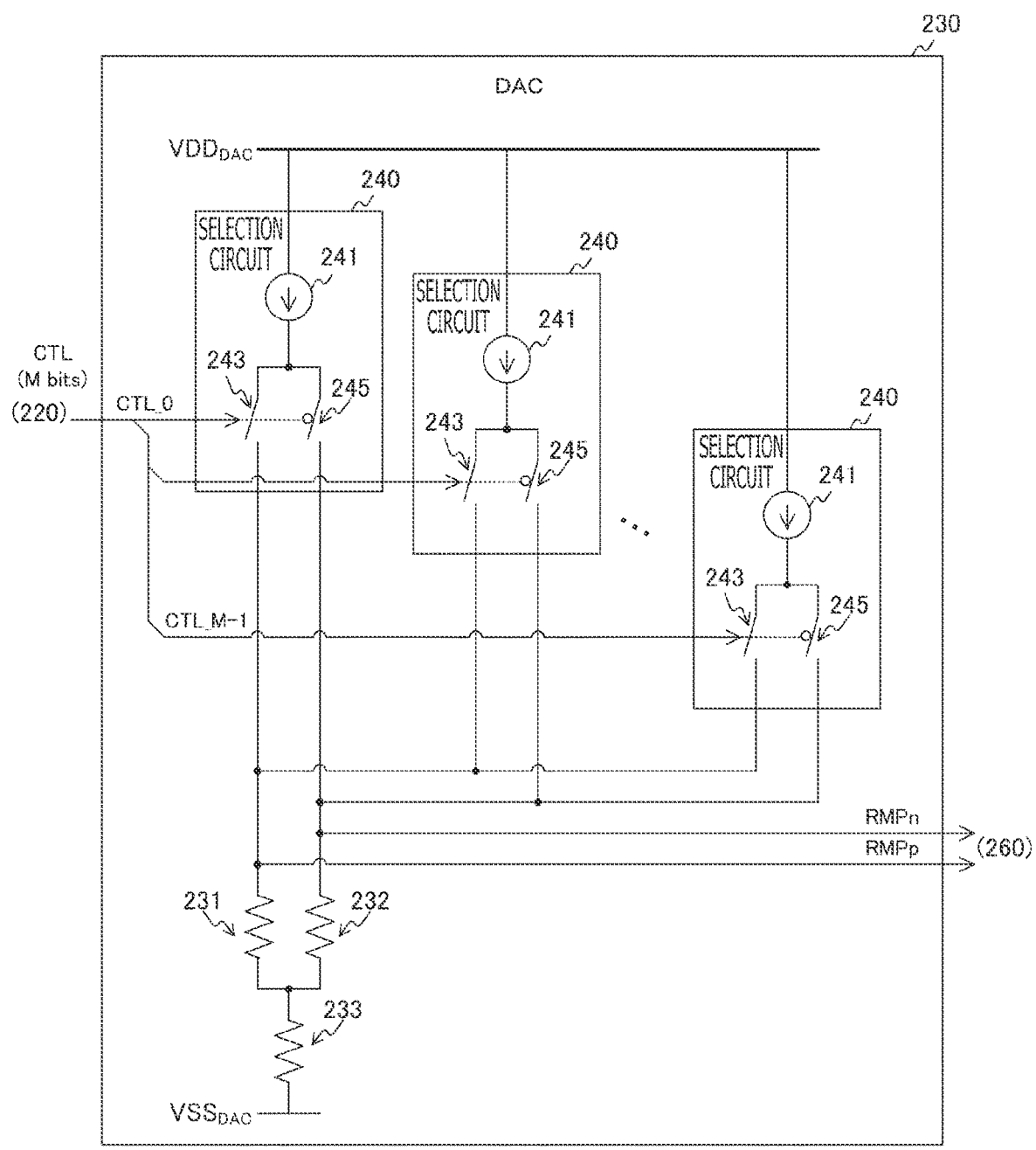
FIG. 9 is a circuit diagram depicting one configuration example of the DAC according to the first embodiment of the present technology.

FIG. 9 is a circuit diagram depicting one configuration example of the DAC 230 according to the first embodiment of the present technology. The DAC 230 includes M (M is an integer) selection circuits 240, and resistors 231 to 233. The selection circuits 240 each include a current source 241 and switches 243 and 245. The M current sources 241 are connected in parallel with the power source terminal of the power source potential $VDD_{DAC}$. Further, from the timing control section 220, an M-bit control signal CTL is inputted to the DAC 230. The m (m is an integer of 1 to M−1)-th bit of the control signal CTL is inputted, as a selection signal CTL_m, to the m-th selection circuit 240.

The current source 241 is configured to supply a predetermined current. The switches 243 and 245 are each configured to output a current from the current source 241 to either one of a pair of output terminals according to the corresponding selection signal CTL_m.

Respective one output terminals of the selection circuits 240 are connected in common to the resistor 231, and the other output terminals are connected in common to the resistor 232. In addition, the resistors 231 and 232 are connected in common to one end of the resistor 233. The other end of the resistor 233 is connected to a terminal of a reference potential $VSS_{DAC}$.

The reference signal RMPp is outputted from the connection point between the resistor 231 and the selection circuits 240. The reference signal RMPn is outputted from the connection point between the resistor 232 and the selection circuits 240.

With the abovementioned configuration, the selection circuits 240 each distribute a total current $I_{FS}$ of the M current sources 241 to the resistor 231 side and the resistor 232 side according to the control signal CTL. Currents divided to the resistor 231 and the resistor 232 are added together again to flow into the resistor 233. Therefore, a terminal potential of the resistor 233 is constant. When the current dividing ratio is defined as k (k is an actual number of 0 to 1) and the resistance values of the resistor 231, the resistor 232, and the resistor 233 are $R_1$, $R_2$, and $R_3$, respectively, the respective voltages $V_{RMPp}$ and $V_{RMPn}$ of the reference signals RMPp and RMPn are expressed by the following expressions:

$$V_{RMPp}=VSS_{DAC}+R_3 \cdot I_{FS}+R_1 \cdot k \cdot I_{FS} \qquad \text{Expression 1}$$

$$V_{RMPn}=VSS_{DAC}+R_3 \cdot I_{FS}+R_2 \cdot (1-k) \cdot I_{FS} \qquad \text{Expression 2}$$

Here, the fact that the pixel signal $V_{vs1}$ and the reference signals RMPp and RMPn are inputted to the differential amplifier 330 via the capacitors 321 to 323 should be focused on. If the capacitors are each properly initialized to an initial voltage, a DC potential between the differential amplifier 330 and the DAC 230 and pixels 251 (including the constant current source 262) can optionally be determined. For this reason, no problem arises if the reference potential $VSS_{DAC}$ is set to 0 volts (V). Further, a potential $V_{CMp}$ of the non-inverted input terminal (+) of the differential amplifier 330 is determined by the divided voltages of the capacitors 321 and 322. When the capacity values of the capacitors 321 and 322 are defined as $C_1$ and $C_2$, respectively, the potential $V_{CMp}$ of the non-inverted input terminal (+) of the differential amplifier 330 is expressed by the following expression:

$$V_{CMp}=V_{vs1} \cdot C_1/(C_1+C_2)+V_{RMPp} \cdot C_2/(C_1+C_2) \qquad \text{Expression 3}$$

Meanwhile, a potential $V_{CMn}$ of the inverted input terminal (−) of the differential amplifier 330 is expressed by the following expression:

$$V_{CMn}=V_{RMPn} \qquad \text{Expression 4}$$

When the potentials $V_{CMp}$ and $V_{CMn}$ become equal to each other, the comparison result CMP is inverted. When the pixel signal $V_{vs1}$ at this time is defined as $V_{vs1eq}$, the following expression is obtained from Expressions 3 and 4:

$$V_{RMPn}=V_{vs1eq} \cdot C_1/(C_1+C_2)+V_{RMPp} \cdot C_2/(C_1+C_2) \qquad \text{Expression 5}$$

When the reference potential $VSS_{DAC}$ is set to 0 volts (V), Expressions 1 and 2 are substituted in Expression 5, and the expression is rearranged, the following expression is obtained:

$$V_{vs1eq}=R_3 \cdot I_{FS}+R_2 \cdot I_{FS} \cdot (1+C_2/C_1)-k\{R_1 \cdot I_{FS} \cdot C_2/C_1+R_2 \cdot I_{FS} \cdot (1+C_2/C_1)\} \qquad \text{Expression 6}$$

Here, as a signal range within which the comparator 320 is operable, a variation amount of the potential $V_{vs1eq}$ when the current dividing ratio k is changed from 0 to 1, is obtained. This is a value obtained by obtaining a full scale that is the maximum value of the amplitude of the DAC 230 in terms of a full scale that is the maximum value of the amplitude of the pixel signal $V_{vs1}$. This value is referred to as an effective full scale. On the basis of Expression 6, an effective full scale $V_{FS}$ is expressed by the following expression:

$$V_{FS}=R_1 \cdot I_{FS} \cdot C_2/C_1+R_2 \cdot I_{FS} \cdot (1+C_2/C_1) \qquad \text{Expression 7}$$

Here, a comparative example in which the DAC 230 supplies a single end signal as a reference signal is assumed. In this comparative example, the capacitor 323 on the inverted input terminal (−) side of the differential amplifier 330 may be connected to a ground terminal, or a comparison target signal generated by dividing the voltage of the pixel signal $V_{vs1}$ to the capacitor 321 and the capacitor 322 may be inputted to the non-inverted input terminal (+) side of the differential amplifier 330. The effective full scale $V_{FS}$ in the former case is expressed only by the first term on the right side in Expression 7. The effective full scale $V_{FS}$ in the latter case is expressed only by the second term on the right side in Expression 7. In a case where a certain target value is set as the effective full scale $V_{FS}$, the maximum value of a voltage to be outputted from the DAC 230 to achieve the target value can be designed to be small in the configuration in which both the first and second term on the right side in Expression 7 are used, compared to the comparative example in which only one of the first and second term is used. In conjunction with this, the power source voltage $VDD_{COM}$ is also set to be small so that power consumption of the DAC 230 can be reduced more than in the comparative example.

Further, in a case where a certain target value is set as the effective full scale $V_{FS}$, the current $I_{FS}$ required to achieve the target value can be set to be smaller in the configuration in which both the first and second term on the right side in Expression 7 are used, than in the comparative example in which only one of the first and second term is used. Accordingly, power consumption of the DAC 230 can be reduced more than in the comparative example.

It is to be noted that the circuits in the DAC 230 are not limited to those illustrated in FIG. 9 as long as the reference signals RMPp and RMPn can be generated.

Figure 10:
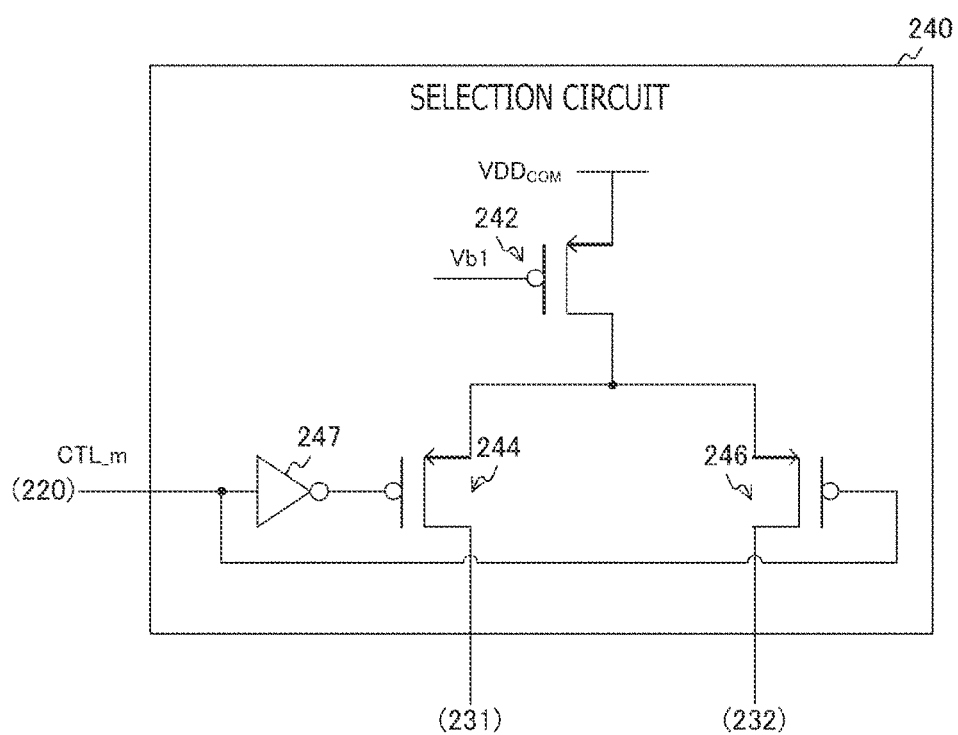
FIG. 10 is a circuit diagram depicting one configuration example of a selection circuit according to the first embodiment of the present technology.

FIG. 10 is a circuit diagram depicting one configuration example of the selection circuit 240 according to the first embodiment of the present technology. The selection circuit 240 includes a current source transistor 242, selection transistors 244 and 246, and an inverter 247. For example, P-type MOS transistors are used as the current source transistor 242, the selection transistor 244, and the selection transistor 246.

The current source transistor 242 has a source connected to the power source terminal and a gate to which a constant bias voltage Vb1 is applied. Vb1 is controlled such that the difference from the power source potential $VDD_{COM}$ becomes constant, for example.

Respective sources of the selection transistors 244 and 246 are connected in common to the drain of the current source transistor 242. Further, the drain of the selection transistor 244 is connected to the resistor 231. The selection transistor 246 has a drain connected to the resistor 232 and a gate to which the selection signal CTL_m is inputted.

The inverter 247 is configured to invert the selection signal CTL_m and supply the resultant signal to the gate of the selection transistor 244.

With the abovementioned configuration, the current source transistor 242 functions as the current source 241 in FIG. 8. A circuit including the inverter 247 and the selection transistors 244 and 246 functions as the switches 243 and 245 in FIG. 8.

Figure 11A:
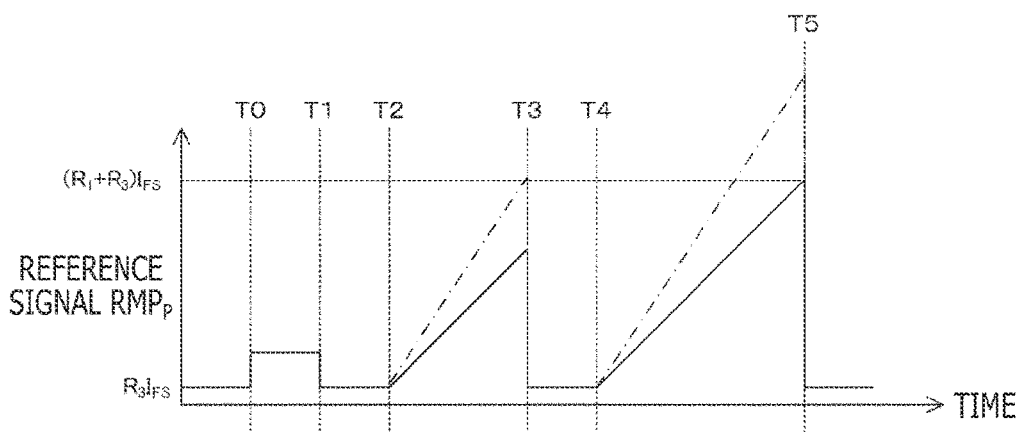
FIGS. 11A and 11B illustrate timing charts depicting one example of fluctuations of reference signals according to the first embodiment of the present technology.
Figure 11B:
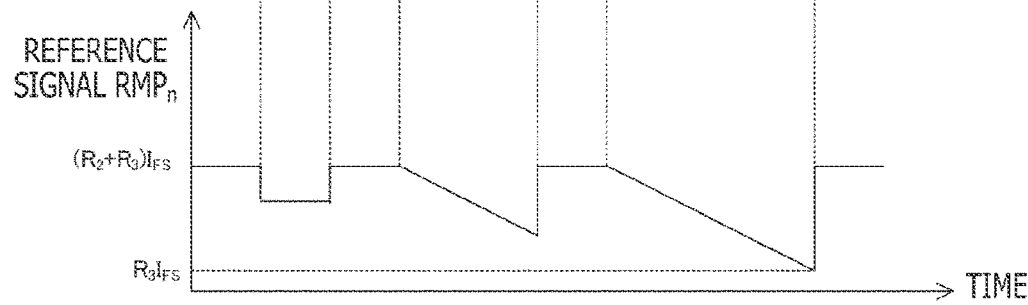

FIGS. 11A and 11B illustrate timing charts depicting one example of fluctuations of reference signals according to the first embodiment of the present technology. In FIGS. 11A and 11B, FIG. 11A is a timing chart depicting one example of a fluctuation of the reference signal RMPp, and FIG. 11B is a timing chart depicting one example of a fluctuation of the reference signal RMPn. In FIGS. 11A and 11B, each ordinate represents the potential of the reference signal, and each abscissa represents a time. In addition, in a of FIG. 11A, a solid line represents the waveform of the reference signal RMPp, and a dashed line represents the waveform of a reference signal of a comparative example.

During a period from timing T0 to T1 immediately before exposure is ended, the timing control section 220 causes the comparator 320 to perform an auto-zero operation by using the auto-zero signal AZ1.

Then, during a period from timing T2 to T3 after the reset level is outputted, the DAC 230 generates the reference signal RMPp which increases with the lapse of time and the reference signal RMPn which decreases with the lapse of time. During this period, AD conversion of the reset level is performed. The amplitude of the reference signal RMPp and the amplitude of the reference signal RMPn are set according to the respective capacity values of the capacitors 321, 322, and 323.

Further, during a period from timing T4 to T5 until the signal level is outputted after the exposure is ended, the DAC 230 generates the reference signal RMPp and the reference signal RMPn again. During this period, AD conversion of the signal level is performed.

The abovementioned control is repeated each time a row is read out. It is to be noted that a period during which the reference signal RMPp changes in a slope-like shape matches a period during which the reference signal RMPn changes in a slope-like shape, but the configuration is not limited to this. For example, these periods may at least partially overlap.

As depicted in FIG. 11A, the amplitude of a reference signal required to achieve the target value of the effective full scale VFS in the comparative example in which a single end signal is used as the reference signal is large, compared to a case where a differential signal is used. Therefore, power consumption of the DAC is increased.

[Operation Example of Solid-State Imaging Element]

Figure 12:
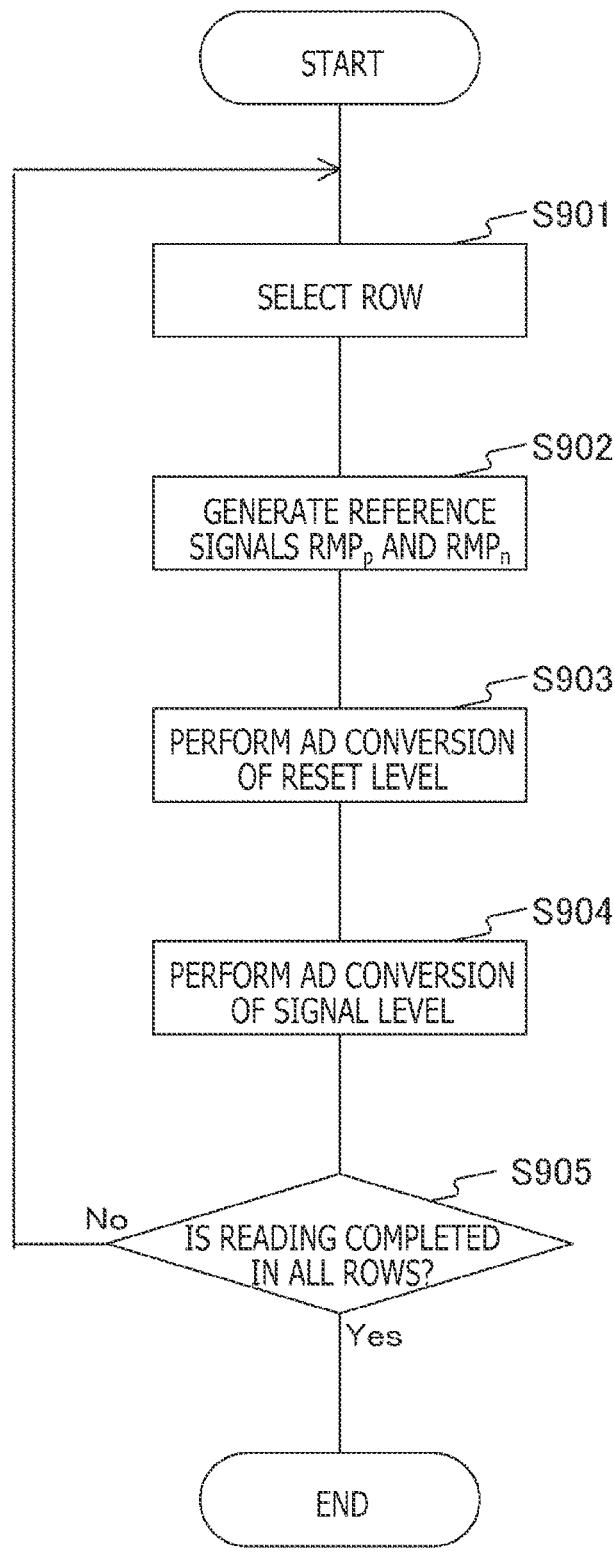
FIG. 12 is a flowchart depicting one example of operation of the solid-state imaging element according to the first embodiment of the present technology.

FIG. 12 is a flowchart depicting one example of operation of the solid-state imaging element 200 according to the first embodiment of the present technology. This operation is started when, for example, a predetermined application for performing imaging to obtain image data is executed.

The row selection section 210 selects and drives an unselected row (step S901). The DAC 230 generates the reference signals RMPp and RMPn (step S902). The ADC 310 performs AD conversion of the reset level (step S903) and performs AD conversion of the signal level (step S904).

The row selection section 210 determines whether or not reading of all the rows is completed (step S905). In a case where reading of all the rows is not completed (step S905: No), the row selection section 210 repeats step S901 and subsequent steps. On the other hand, in a case where reading of all the rows is completed (step S905: Yes), the row selection section 210 ends the operation for performing imaging to obtain image data. In a case where a plurality of sets of image data is successively obtained by imaging, steps S901 to S905 are repeated in synchronization with the vertical synchronization signal VSYNC.

According to the first embodiment of the present technology, a signal corresponding to the value of an input signal with respect to one differential signal (RMPp) is compared with the other differential signal (RMPn), as described above. Therefore, the amplitude of a reference signal can be set to be small, compared to a case where a single end signal is used. Accordingly, power consumption of the DAC 230 that supplies the reference signals can be reduced.

2. Second Embodiment

In the abovementioned first embodiment, the internal circuits of the solid-state imaging element 200 are disposed on a single semiconductor board. However, when the number of pixels is increased, the circuit scale of the semiconductor board becomes larger. A solid-state imaging element according to a second embodiment is different from that of the first embodiment in that the internal circuits of the solid-state imaging element 200 according to the second embodiment are disposed on a plurality of layered boards in a distributed manner.

Figure 13:
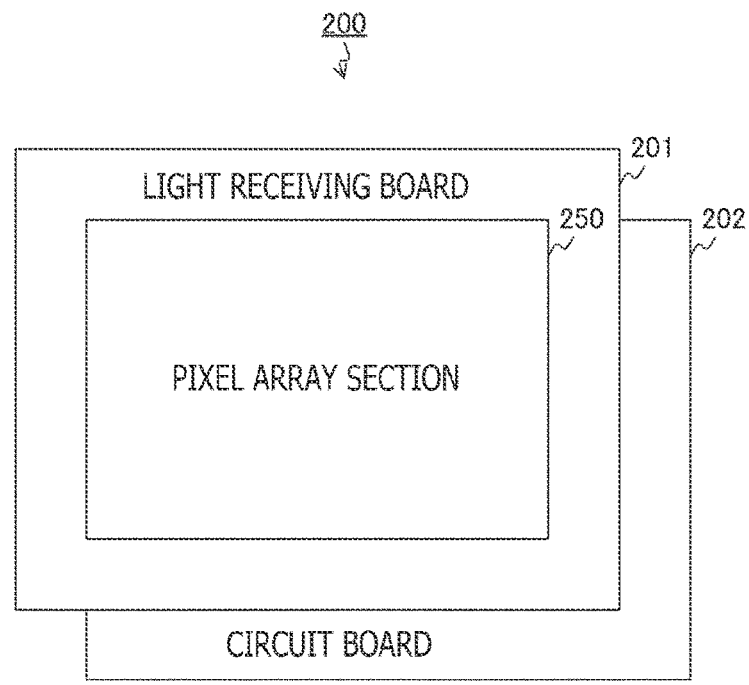
FIG. 13 is a diagram depicting one example of a layered structure in a solid-state imaging element according to a second embodiment of the present technology.

FIG. 13 is a diagram depicting one example of a layered structure of the solid-state imaging element 200 according to the second embodiment of the present technology. The solid-state imaging element 200 includes a light receiving board 201 and a circuit board 202. These boards are layered, are electrically connected, and constitute one semiconductor chip.

The pixel array section 250 is disposed on the light receiving board 201. Also, the row selection section 210, the timing control section 220, the DAC 230, the column signal processing section 260, and the horizontal transfer scanning section 270 are disposed on the circuit board 202.

According to the second embodiment of the present technology, the internal circuits of the solid-state imaging element 200 are disposed on a plurality of boards in a distributed manner, as described above. Therefore, a circuit scale per board can be reduced.

3. Third Embodiment

In the abovementioned first embodiment, only the differential amplifier 330 is disposed as an amplification circuit in the comparator 320. However, the differential amplifier 330 alone may be insufficient to drive the counter 390 and the posterior circuits. A third embodiment is different from the first embodiment in that the comparator 320 according to the third embodiment further includes an output amplifier that amplifies an output from the differential amplifier 330.

Figure 14:
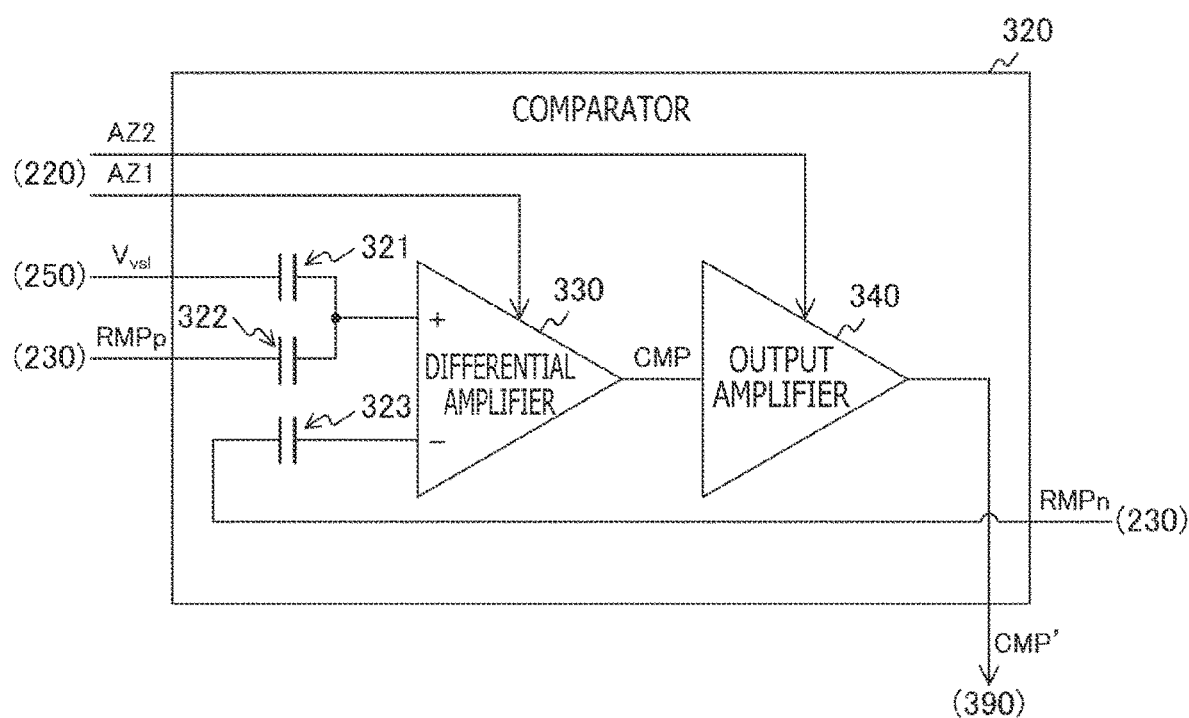
FIG. 14 is a circuit diagram depicting one configuration example of a comparator according to a third embodiment of the present technology.

FIG. 14 is a circuit diagram depicting one configuration example of the comparator 320 according to the third embodiment of the present technology. The comparator 320 according to the third embodiment is different from that of the first embodiment in that the comparator 320 according to the third embodiment further includes an output amplifier 340.

The output amplifier 340 is configured to amplify the comparison result CMP by a predetermined gain. The output amplifier 340 outputs an amplified signal as CMP' to the counter 390. Further, an auto-zero signal AZ2 from the timing control section 220 is inputted to the output amplifier 340.

Figure 15:
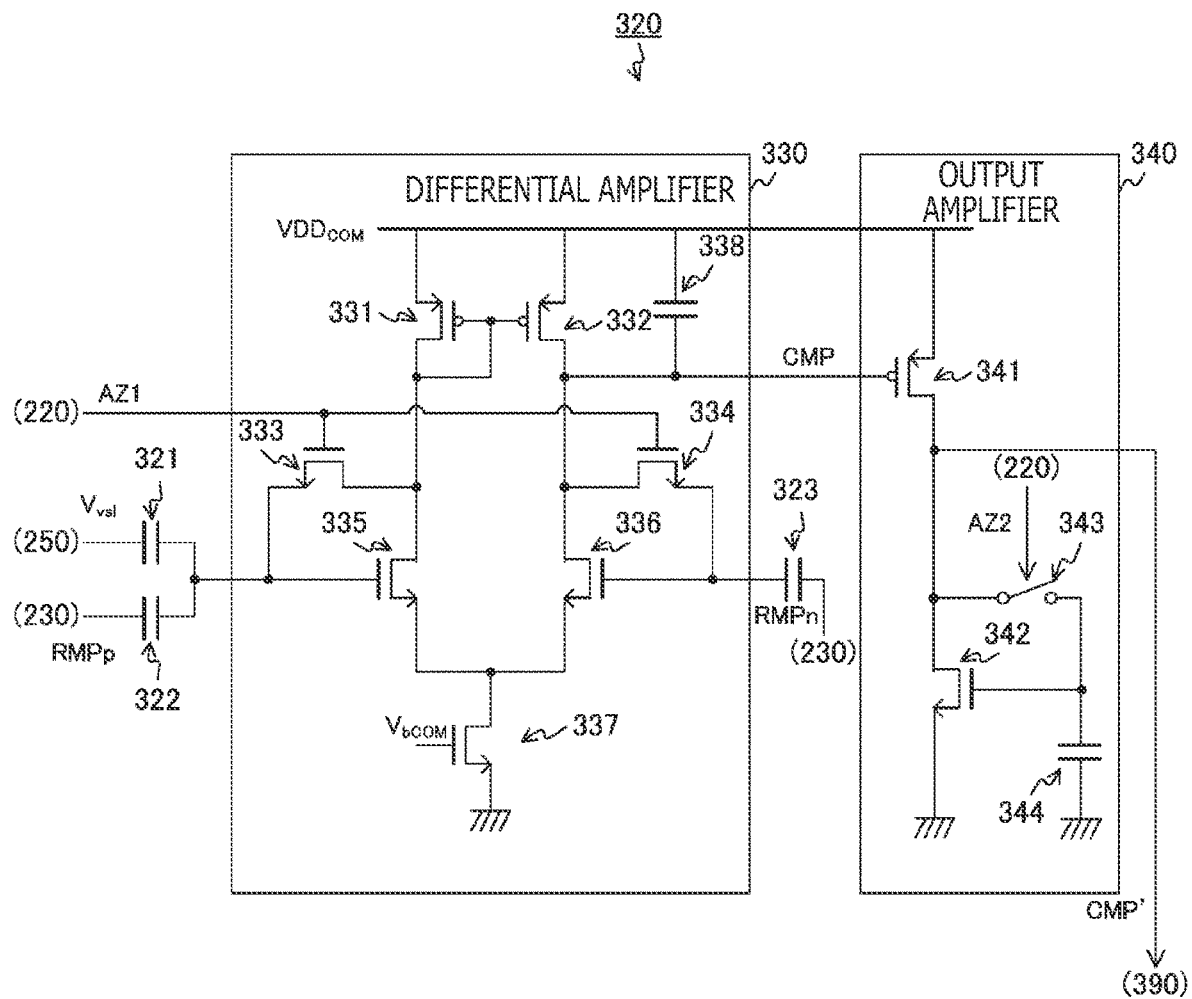
FIG. 15 is a circuit diagram depicting one configuration example of a differential amplifier and an output amplifier according to the third embodiment of the present technology.

FIG. 15 is a circuit diagram depicting one configuration example of the differential amplifier 330 and the output amplifier 340 according to the third embodiment of present technology. The differential amplifier 330 according to the third embodiment is different from that of the first embodiment in that the differential amplifier 330 according to the third embodiment further includes a capacitor 338. In addition, the output amplifier 340 includes a P-type transistor 341, an N-type transistor 342, a switch 343, and a capacitor 344. For example, MOS transistors are used as the P-type transistor 341 and the N-type transistor 342.

The capacitor 338 is interposed between the power source terminal and the connection point (i.e., the output terminal of the differential amplifier 330) between the P-type transistor 332 and the N-type transistor 336.

The P-type transistor 341 and the N-type transistor 342 are connected in series between the power source terminal and the ground terminal. In addition, the gate of the P-type transistor 341 is connected to the output terminal of the differential amplifier 330, and the comparison result CMP' is outputted from the connection point between the P-type transistor 341 and the N-type transistor 342.

The capacitor 344 is interposed between the gate of the N-type transistor 342 and the ground terminal. The switch 343 opens/closes a path between the drain and the gate of the N-type transistor 342 according to the auto-zero signal AZ2.

With the abovementioned configuration, the output amplifier 340 further amplifies an output from the differential amplifier 330 and outputs the resultant signal. Further, the output amplifier 340 performs an auto-zero operation according to the auto-zero signal AZ2.

According to the third embodiment of the present technology, the output amplifier 340 that further amplifies an output from the differential amplifier 330 is added into the comparator 320, as described above. Therefore, a driving force for the counter 390 and the posterior circuits can be increased.

4. Fourth Embodiment

In the abovementioned third embodiment, the output amplifier 340 is further disposed. However, this configuration may cause streaking which is streaky noise. The reason for this is that, in the configuration in which the reference signal RMPn is applied to the gate of the output-side N-type transistor 336 of the differential amplifier 330, when the amplitude of an output from the differential amplifier 330 is large, an interference with the reference signal RMPn occurs. A fourth embodiment is different from that of the third embodiment in that the comparator 320 according to the forth embodiment restricts the amplitude of an output from the differential amplifier 330, thereby suppressing streaking.

Figure 16:
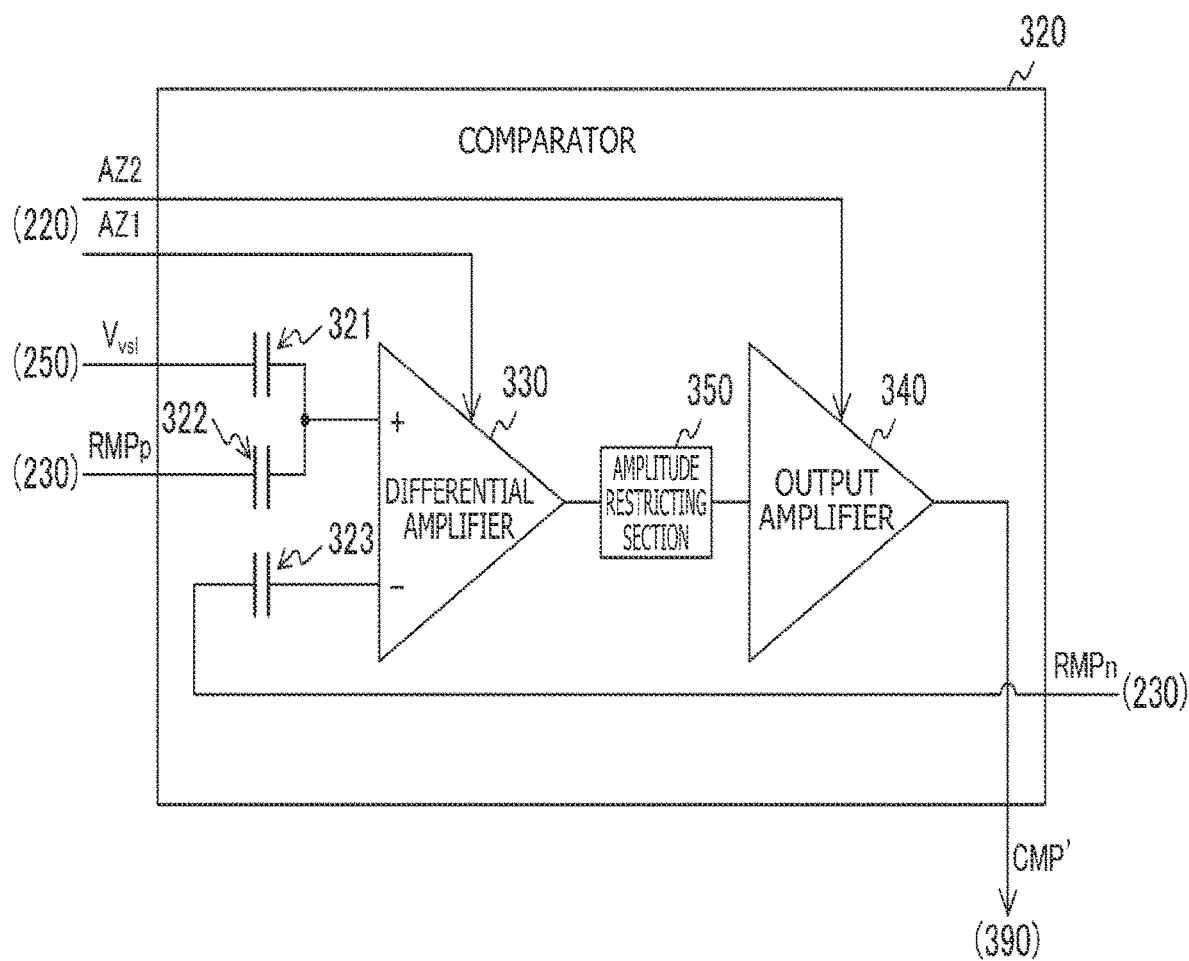
FIG. 16 is a circuit diagram depicting one configuration example of a comparator according to a fourth embodiment of the present technology.

FIG. 16 is a circuit diagram depicting one configuration example of the comparator 320 according to the fourth embodiment of the present technology. The comparator 320 according to the fourth embodiment is different from that of the third embodiment in that the comparator 320 according to the fourth embodiment further includes an amplitude restricting section 350.

The amplitude restricting section 350 is configured to restrict the amplitude of an output (comparison result CMP) from the differential amplifier 330 to a certain range and supply the resultant signal to the output amplifier 340.

Figure 17:
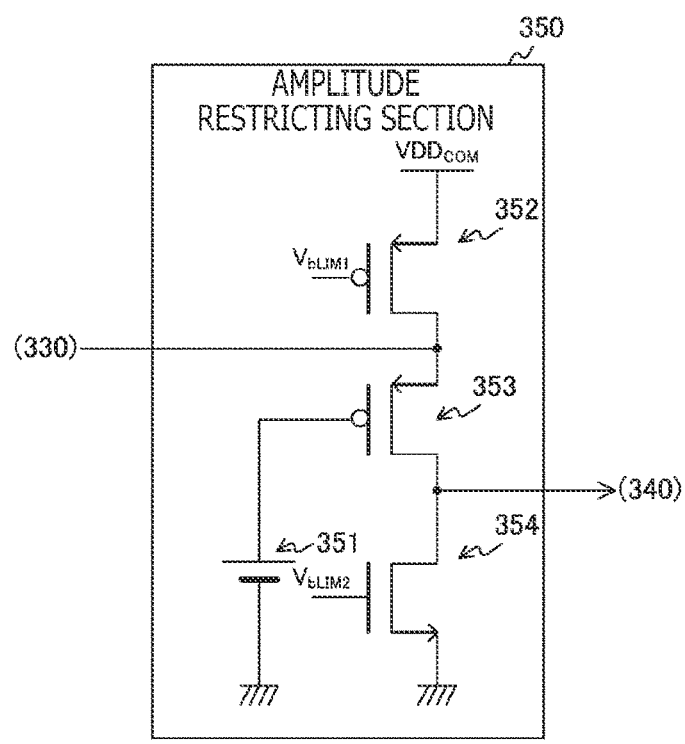
FIG. 17 is a circuit diagram depicting one configuration example of an amplitude restricting section according to the fourth embodiment of the present technology.

FIG. 17 is a circuit diagram depicting one configuration example of the amplitude restricting section 350 according to the fourth embodiment of the present technology. The amplitude restricting section 350 includes a bias voltage supply section 351, a current source transistor 352, a gate-grounded transistor 353, and a current source transistor 354. As the current source transistor 352, a P-type MOS transistor is used, for example. As the current source transistor 354, an N-type MOS transistor is used, for example. As the gate-grounded transistor 353, a P-type MOS transistor is used, for example.

The bias voltage supply section 351 is configured to generate a constant bias voltage and supply the constant bias voltage to the gate of the gate-grounded transistor 353.

The current source transistor 352, the gate-grounded transistor 353, and the current source transistor 354 are connected in series between the power source terminal and the ground terminal. Further, the connection point between the current source transistor 352 and the gate-grounded transistor 353 is connected to the output terminal of the input-side differential amplifier 330. The connection point between the gate-grounded transistor 353 and the current source transistor 354 is connected to the input terminal of the output-side output amplifier 340.

A constant bias voltage $V_{bLIM1}$ is applied to the gate of the current source transistor 352, and a constant bias voltage $V_{bLIM2}$ is applied to the gate of the current source transistor 354. These transistors each function as a current source. It is to be noted that the current source transistor 352 is one example of the power source-side current source set forth in the claims, and the current source transistor 354 is one example of the ground-side current source set forth in the claims.

With the abovementioned configuration, an output (comparison result CMP) from the differential amplifier 330 is restricted to a range that is lower than a predetermined upper limit value and outputs the resultant signal to the output amplifier 340.

According to the fourth embodiment of the present technology, the amplitude of an output from the differential amplifier 330 is restricted, as described above. Therefore, an interference between the output and the reference signal RMPn can be suppressed. Accordingly, streaking which is caused by such an interference can be suppressed.

[First Modification]

In the abovementioned fourth embodiment, even during an auto-zero operation of the differential amplifier 330, the amplitude restricting section 350 is connected to the differential amplifier 330. In this configuration, during an auto-zero operation, an output of the differential amplifier 330 to generate a potential according to variation or mismatch in the circuit structure or element is directly connected to the source of the gate-grounded transistor 353 the potential of which is previously determined. Therefore, an abnormal current may flow to deteriorate the auto-zero property. An amplitude restricting section according to a first modification of the fourth embodiment of the present technology is different from that of the first embodiment in that the amplitude restricting section according to the first modification interrupts an input from the differential amplifier 330 during an auto-zero operation.

Figure 18:
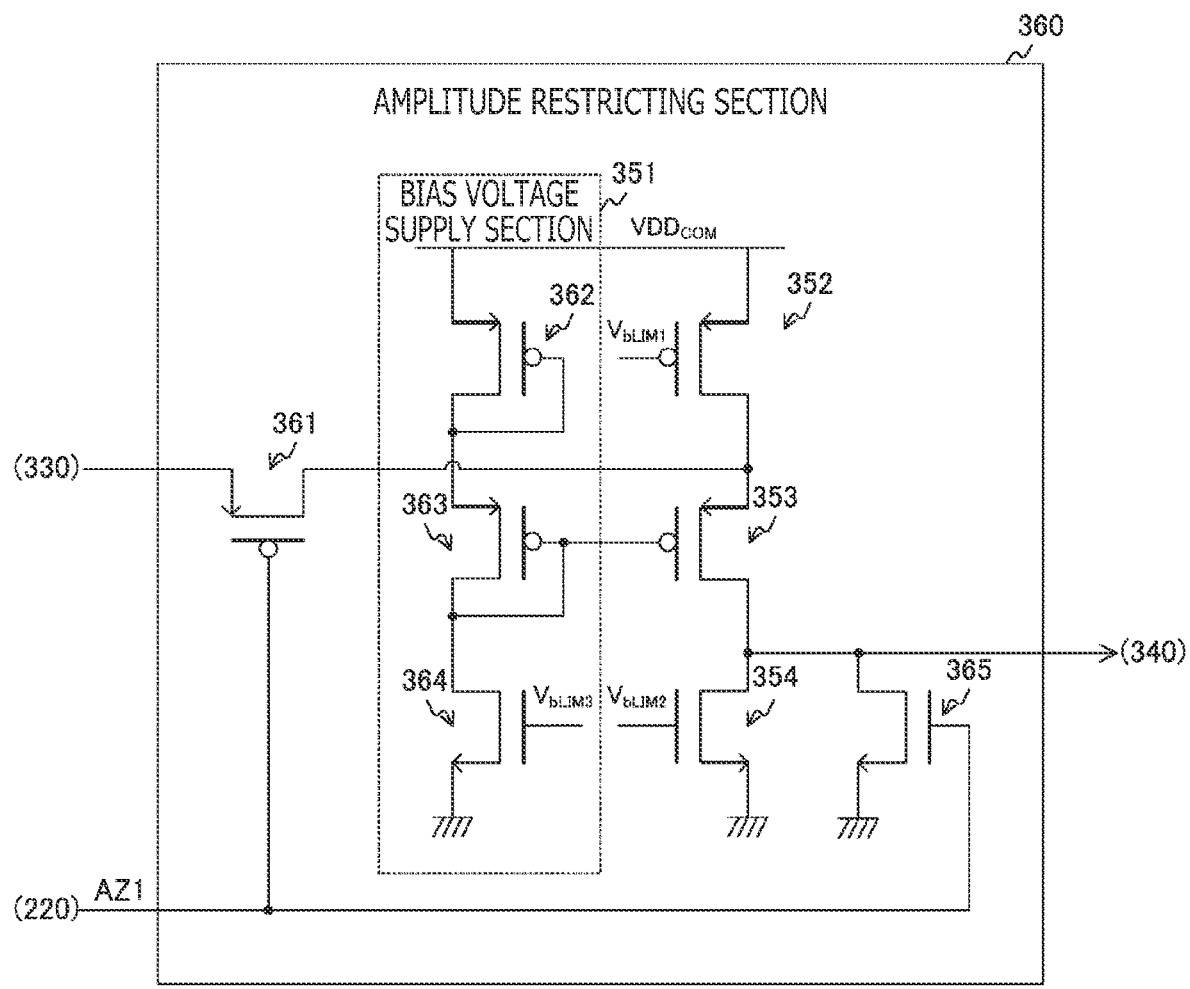
FIG. 18 is a circuit diagram depicting one configuration example of an amplitude restricting section according to a first modification of the fourth embodiment of the present technology.

FIG. 18 is a circuit diagram depicting one configuration example of the amplitude restricting section 360 according to the first modification of the fourth embodiment of the present technology. In the first modification of the fourth embodiment, the amplitude restricting section 360 is disposed in place of the amplitude restricting section 350.

The amplitude restricting section 360 is different from that of the forth embodiment in that the amplitude restricting section 360 further includes switch transistors 361 and 365. As the switch transistor 361, a P-type MOS transistor is used, for example. As the switch transistor 365, an N-type MOS transistor is used, for example. The respective gates of the switch transistors 361 and 365 are both driven with the auto-zero signal AZ1. In addition, the bias voltage supply section 351 includes P-type transistors 362 and 363 and a current source transistor 364, for example.

The switch transistor 361 is configured to open/close a path between the output terminal of the differential amplifier 330 and the connection point between the current source transistor 352 and the gate-grounded transistor 353 according to the auto-zero signal AZ1 from the timing control section 220. It is to be noted that the switch transistor 361 is one example of the input-side switch set forth in the claims.

The switch transistor 365 is configured to open/close a path between the ground terminal and the connection point between the input terminals of the gate-grounded transistor 353, the current source transistor 354, and the output amplifier 340 according to the auto-zero signal AZ1 from the timing control section 220. It is to be noted that the switch transistor 365 is one example of the output-side switch set forth in the claims.

In addition, the P-type transistors 362 and 363 and the current source transistor 364 are connected in series between the power source terminal and the ground terminal. The gate and the drain of the P-type transistor 362 are short-circuited. Further, the gate of the gate-grounded transistor 353 is connected to the drain of the gate-grounded transistor 353 itself and the gate of the P-type transistor 363. As these transistors, MOS transistors are used, for example. A constant bias voltage $V_{bLIM3}$ is applied to the gate of the current source transistor 364. The current source transistor 364 functions as a current source. As the current source transistor 364, an N-type MOS transistor is used, for example.

In a case where the auto-zero signal AZ1 is at a high level, the differential amplifier 330 performs an auto-zero operation and generates, as an output, a potential which has been lowered from the power source potential $VDD_{COM}$ by the gate-source voltage $V_{GS}$ of the N-type transistor 331. The bias voltage supply section 351 outputs a potential to drive the gate of the gate-grounded transistor 353 such that the source potential of the gate-grounded transistor 353 is substantially equal to a potential that is lower than the power source potential $VDD_{COM}$ by the output during the auto-zero of the differential amplifier 330, that is, by the gate-source voltage $V_{GS}$ of the N-type transistor 331. The input-side switch transistor 361 enters an open state, and the output-side switch transistor 365 enters a closed state. An output from the amplitude restricting section 360 is a ground potential.

On the other hand, in a case where the auto-zero signal AZ1 is at a low level, the N-type transistors 333 and 334 in the differential amplifier 330 are in an OFF state, and the differential amplifier 330 performs differential amplification. In addition, the switch transistor 361 on the input side of the amplitude restricting section 360 enters a closed state, and the switch transistor 365 on the output side enters an open state. Here, the source potential of the gate-grounded transistor 353, which is determined on the basis of an output from the bias voltage supply section 351 when the auto-zero signal AZ1 is at a high level, is set to be substantially equal to the potential of an output from the differential amplifier 330. Therefore, even during a transient phenomenon when the switch transistor 361 is shifted to the closed state, no abnormal current flows in the amplitude restricting section 350.

According to the first modification of the fourth embodiment of the present technology, the switch transistor 361 that interrupts an output from the differential amplifier 330 during an auto-zero operation of the differential amplifier 330 is disposed, as described above. Therefore, occurrence of an abnormal current and deterioration of the auto-zero property in the amplitude restricting section 350 can be prevented.

[Second Modification]

In the abovementioned fourth embodiment, an output from the differential amplifier 330 is restricted to a range that is lower than an upper limit value. However, it is also desirable to set a lower limit value. A second modification of the fourth embodiment is different from the fourth embodiment in that an amplitude restricting section according to the second modification restricts an output from the differential amplifier 330 to a range of a lower limit value to an upper limit value.

Figure 19:
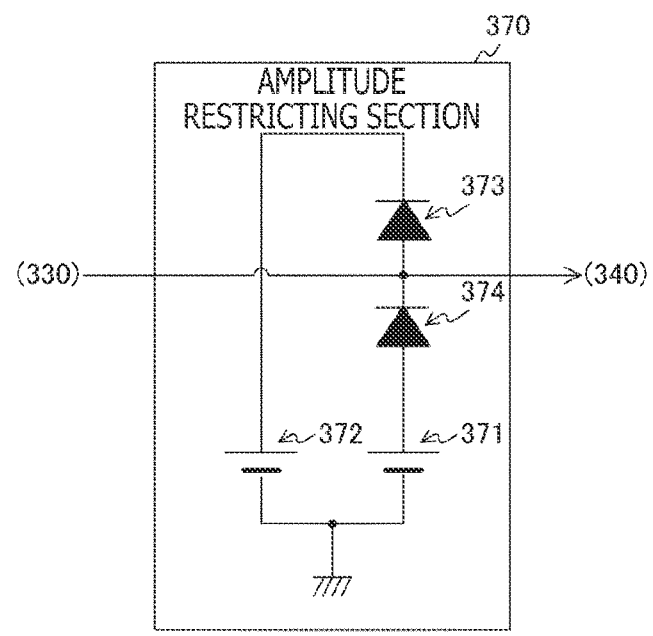
FIG. 19 is a circuit diagram depicting one configuration example of an amplitude restricting section according to a second modification of the fourth embodiment of the present technology.

FIG. 19 is a circuit diagram depicting one configuration example of an amplitude restricting section 370 according to the second modification of the fourth embodiment of the present technology. In the second modification of the fourth embodiment, the amplitude restricting section 370 is disposed in place of the amplitude restricting section 350.

The amplitude restricting section 370 includes bias voltage supply sections 371 and 372 and diodes 373 and 374. The diodes 373 and 374 are connected in series between the bias voltage supply sections 371 and 372. The cathode of the diode 373 is connected to the bias voltage supply section 372. The anode of the diode 374 is connected to the bias voltage supply section 371. Further, the connection point between the diodes 373 and 374 is connected to the output terminal of the differential amplifier 330 and the input terminal of the output amplifier 340.

The bias voltage supply sections 371 and 372 are configured to supply bias voltages $V_1$ and $V_2$, respectively, which are different from each other.

With the abovementioned configuration, the voltage $V_{CMP}$ of an output (comparison result CMP) from the differential amplifier 330 is restricted to a restriction range that is expressed by the following expression:

$$V_1 - V_F < V_{CMP} < V_2 + V_F$$

wherein $V_F$ represents a forward voltage of the diodes 373 and 374.

According to the second modification of the fourth embodiment of the present technology, an output from the differential amplifier 330 is restricted to a range of a lower limit value to an upper limit value, as described above. Therefore, an interference between the output and the reference signal RMPn can sufficiently be suppressed.

19

[Third Modification]

In the abovementioned fourth embodiment, an output from the differential amplifier 330 is restricted to a range that is lower than an upper limit value. However, it is also desirable to set a lower limit value. A third modification of the fourth embodiment is different from the fourth embodiment in that an amplitude restricting section according to the third modification restricts an output from the differential amplifier 330 to a range of a lower limit value to an upper limit value.

Figure 20:
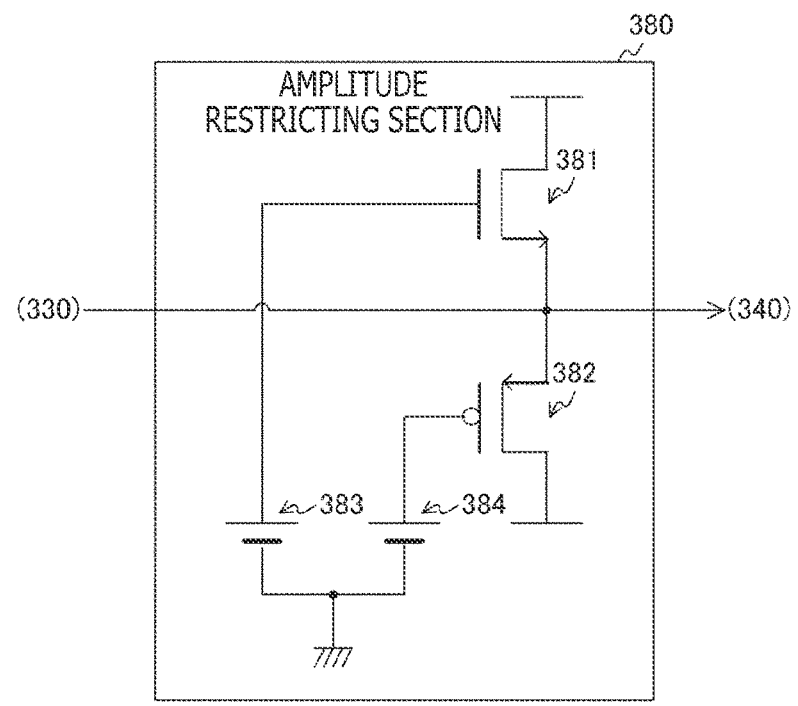
FIG. 20 is a circuit diagram depicting one configuration example of an amplitude restricting section according to a third modification of the fourth embodiment of the present technology.

FIG. 20 is a circuit diagram depicting one configuration example of an amplitude restricting section 380 according to the third modification of the fourth embodiment of the present technology. In the third modification of the fourth embodiment, the amplitude restricting section 380 is disposed in place of the amplitude restricting section 350.

The amplitude restricting section 380 includes an N-type transistor 381, a P-type transistor 382, and bias voltage supply sections 383 and 384.

The N-type transistor 381 and the P-type transistor 382 are connected in series between the power source terminal and the ground terminal. In addition, the connection point between the N-type transistor 381 and the P-type transistor 382 is connected to the output terminal of the differential amplifier 330 and the input terminal of the output amplifier 340.

The bias voltage supply sections 383 and 384 are configured to supply bias voltages $V_3$ and $V_4$, respectively, which are different from each other. The bias voltage $V_3$ is applied to the gate of the N-type transistor 381. The bias voltage $V_4$ is applied to the gate of the P-type transistor 382. The voltage combination is set in such a way that the N-type transistor 381 and the P-type transistor 382 are not simultaneously in the ON state.

With the abovementioned configuration, the voltage $V_{CMP}$ of an output (comparison result CMP) from the differential amplifier 330 is restricted to a restriction range indicated by the following expression:

$$V_3 - V_{GSN} < V_{CMP} < V_4 + V_{GSP}$$

wherein $V_{GSN}$ represents a gate-source voltage of the N-type transistor 381 in the ON state and $V_{GSP}$ represents a gate-source voltage of the P-type transistor 382 in the ON state.

According to the third modification of the fourth embodiment of the present technology, an output from the differential amplifier 330 is restricted to a range of a lower limit value to an upper limit value, as described above. Therefore, an interference between the output and the reference signal RMPn can sufficiently be suppressed.

5. Fifth Embodiment

In the DAC 230 of the abovementioned first embodiment, the current source transistors 242 are disposed for the respective selection circuits 240, whereby currents are generated. However, when the drain-source voltage of a transistor fluctuates due to a fluctuation of a power source, or the like, the drain current value varies according to a unique characteristic of the transistor. Therefore, the output accuracy of the DAC 230 may be deteriorated. Specifically, for example, the full scale accuracy or the linearity may be deteriorated. A fifth embodiment is different from the first embodiment in that, in the DAC 230 according to the fifth embodiment, a cascode transistor is connected to the current source transistor 242 via the selection transistors 244 and 246 so that the linearity is ensured.

20

Figure 21:
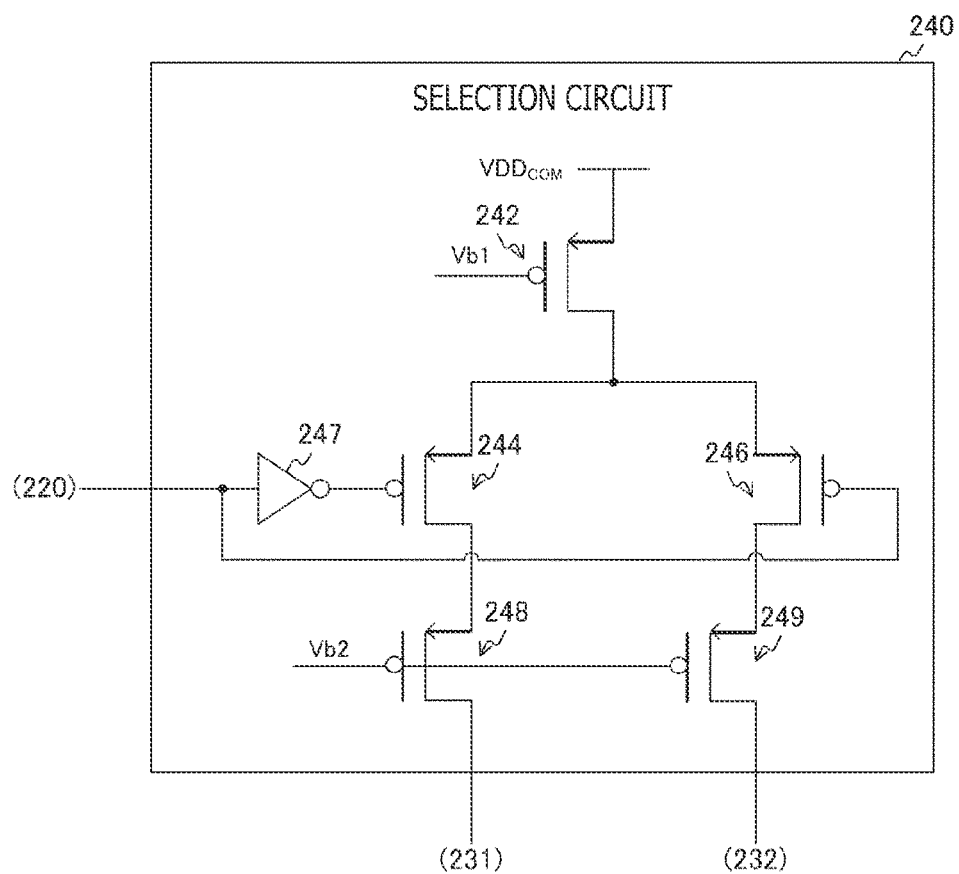
FIG. 21 is a circuit diagram depicting one configuration example of a selection circuit according to a fifth embodiment of the present technology.

FIG. 21 is a circuit diagram depicting one configuration example of the selection circuit 240 according to the fifth embodiment of the present technology. The selection circuit 240 according to the fifth embodiment is different from that of the first embodiment in that the selection circuit 240 according to the fifth embodiment further includes cascode transistors 248 and 249. As these transistors, P-type MOS transistors are used, for example.

The cascode transistor 248 has a source connected to the selection transistor 244 and a drain connected to the resistor 231 and an output terminal for outputting the reference signal RMPp. The cascode transistor 249 has a source connected to the selection transistor 246 and a drain connected to the resistor 232 and an output terminal for outputting the reference signal RMPn. Further, a bias voltage Vb2 is applied to the gates of the cascode transistors 248 and 249 in order to stabilize the drain-source voltage of the current source transistor 242.

With the abovementioned configuration, with respect to the total fluctuation of the drain-source voltage of the current source transistor 242 and the drain-source voltage of a transistor, between the cascode transistors 248 and 249, that becomes ON on the basis of the value of the selection signal CTL_m, a fluctuation of the gate-source voltage of the current source transistor 242 is smaller than that in the first embodiment. Accordingly, deterioration of the output accuracy of the DAC 230 can be further lessened, compared to the first embodiment.

According to the fifth embodiment of the present technology, the cascode transistors 248 and 249 are connected in series to the current source transistor 242 via the selection transistors 244 and 246, as described above. Therefore, with respect to the total fluctuation of the drain-source voltages of these transistors, a fluctuation of the drain-source voltage of the current source transistor 242 is small. Accordingly, the output accuracy of the DAC 230 can be improved.

6. Sixth Embodiment

In the abovementioned first embodiment, the voltage division circuit including the capacitors 321 and 322 is provided on the non-inverted input terminal of the differential amplifier 330, while no voltage division circuit is provided on the inverted input terminal of the differential amplifier 330. Therefore, to balance the amplitudes of the inverted input terminal and the non-inverted input terminal of the differential amplifier 330, for example, the amplitude of the reference signal RMPp needs to be larger than that of the reference signal RMPn. However, from the viewpoint of suppressing an interference with noise, etc., it is desirable that the symmetry between the differential properties of the reference signals RMPp and RMPn is high. A sixth embodiment is different from the first embodiment in that the solid-state imaging element 200 according to the sixth embodiment generates the reference signals RMPp and RMPn with high symmetry of the differential properties.

Figure 22:
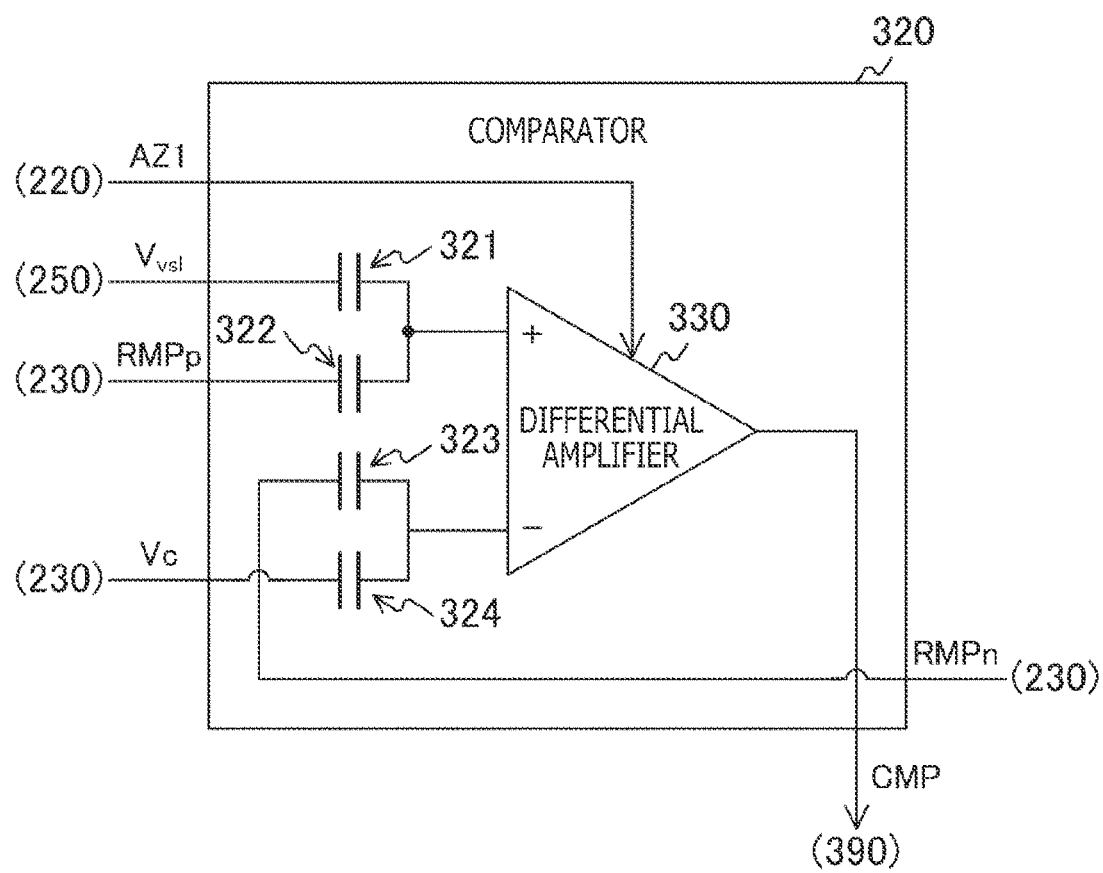
FIG. 22 is a circuit diagram depicting one configuration example of a comparator according to a sixth embodiment of the present technology.

FIG. 22 is a circuit diagram depicting one configuration example of the comparator 320 according to the sixth embodiment of the present technology. The comparator 320 is different from that of the first embodiment in that the comparator 320 according to the sixth embodiment further includes a capacitor 324. The capacitor 324 has one end to which a predetermined fixed voltage Vc is inputted and the other end connected, together with the capacitor 323, to the inverted input terminal (−) of the differential amplifier 330. The capacitors 323 and 324 divide the voltage difference between the reference signal RMPn and the fixed voltage Vc. It is to be noted that a circuit including the capacitors 323 and 324 is one example of the reference-side voltage division circuit set forth in the claims.

The potential $V_{CMp}$ of the non-inverted input terminal (+) of the differential amplifier 330 is expressed by Expression 3, as in the first embodiment. However, when the respective capacity values of the capacitors 323 and 324 are defined as $C_3$ and $C_4$, respectively, the potential $V_{CMn}$ of the inverted input terminal (−) of the differential amplifier 330 is expressed by the following expression:

$$V_{CMn}=V_c \cdot C_4/(C_3+C_4)+V_{RMPn} \cdot C_3/(C_3+C_4) \quad \text{Expression 10}$$

When the potentials $V_{CMp}$ and $V_{CMn}$ become equal to each other, the comparison result CMP is inverted. When the pixel signal $V_{vs1}$ at this time is defined as $V_{vs1eq}$, the following expression is obtained from Expressions 3 and 10:

$$V_{vs1eq} \cdot C_1/(C_1+C_2)+V_{RMPp} \cdot C_2/(C_1+C_2)=V_c \cdot C_4/(C_3+C_4)+V_{RMPn} \cdot C_3/(C_3+C_4) \quad \text{Expression 11}$$

When the reference potential $VSS_{DAC}$ is set to 0 volts (V), Expressions 1 and 2 are substituted in Expression 11 and the expression is rearranged, and the following expression is obtained:

$$V_{vs1eq}=V_c \cdot C_4(C_1+C_2)/\{(C_3+C_4)C_1\}+R_3 \cdot I_{FS} \cdot C_3(C_1+C_2)/\{(C_3+C_4)C_1\}-R_3 \cdot I_{FS} \cdot C_2/C_1+R_2 \cdot I_{FS} \cdot C_3(C_1+C_2)/\{(C_3+C_4)C_1\}-k \cdot R_1 \cdot I_{FS} \cdot C_2/C_1-k \cdot R_2 \cdot I_{FS} \cdot C_3(C_1+C_2)/\{(C_3+C_4)C_1\} \quad \text{Expression 12}$$

On the basis of Expression 12, the effective full scale $V_{FS}$ is expressed by the following expression:

$$V_{FS}=R_1 \cdot I_{FS} \cdot C_2/C_1+R_2 \cdot I_{FS} \cdot C_3(C_1+C_2)/\{(C_3+C_4)C_1\} \quad \text{Expression 13}$$

It is to be noted that, in order to further improve the symmetry of the differential properties, the resistance values and the capacity values may be set so as to satisfy the following expressions:

$$R_1=R_2 \quad \text{Expression 14}$$

$$C_3/C_4=C_2/C_1 \quad \text{Expression 15}$$

By applying Expressions 14 and 15 to Expressions 12 and 13, the following expressions are obtained:

$$V_{vs1eq}=V_c+R_2 \cdot I_{FS} \cdot C_2/C_1-k \cdot 2R_1 \cdot I_{FS} \cdot C_2/C_1$$

$$V_{FS}=2R_1 \cdot I_{FS} \cdot C_2/C_1$$

Figure 23:
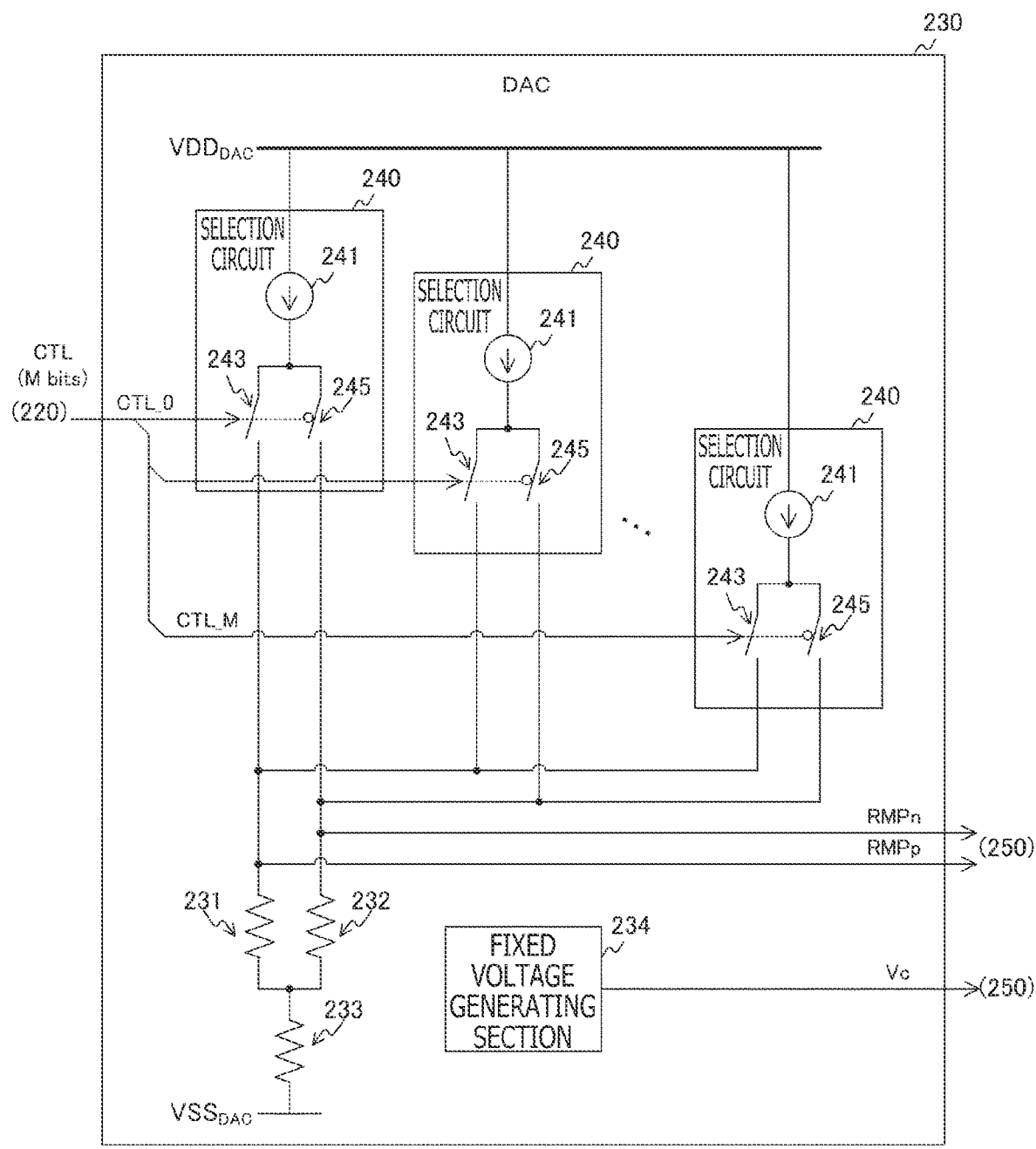
FIG. 23 is a circuit diagram depicting one configuration example of a DAC according to the sixth embodiment of the present technology.

FIG. 23 is a circuit diagram depicting one configuration example of the DAC 230 according to the sixth embodiment of the present technology. The sixth embodiment is different from the first embodiment in that the DAC 230 according to the sixth embodiment further includes a fixed voltage generating section 234. The fixed voltage generating section 234 is configured to generate the fixed voltage Vc and supply the fixed voltage Vc to the comparator 320.

It is to be noted that the fixed voltage generating section 234 is disposed in the DAC 230, but may be disposed outside the DAC 230.

Figure 24A:
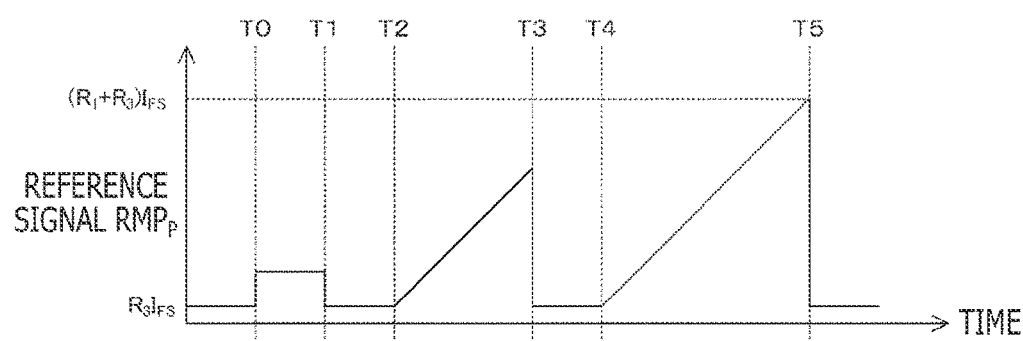
FIGS. 24A and 24B illustrate timing charts depicting one example of fluctuations of reference signals according to the sixth embodiment of the present technology.
Figure 24B:
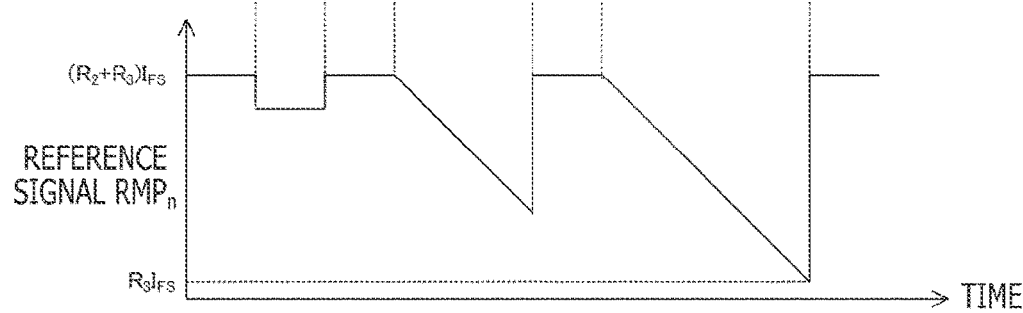

FIGS. 24A and 24B illustrate timing charts depicting one example of fluctuations of reference signals according to the sixth embodiment of the present technology. In FIGS. 24A and 24B, FIG. 24A is a timing chart depicting one example of a fluctuation of the reference signal RMPp, and FIG. 24B is a timing chart depicting one example of a fluctuation of the reference signal RMPn. In FIGS. 24A and 24B, each ordinate represents the potential of the reference signal, and each abscissa represents a time. As depicted in FIGS. 24A and 24B, the symmetry between the waveform of the reference signal RMPp and the waveform of the reference signal RMPn is improved, compared to the first embodiment.

According to the sixth embodiment of the present technology, voltage division is separately performed by the capacitors 321 and 322 and the capacitors 323 and 324 in the comparator 320, as described above. Therefore, the DAC 230 can supply the reference signals RMPp and RMPn with high symmetry of the differential properties. Accordingly, an interference between noise, etc. and the reference signals can be suppressed.

7. Examples of Application to Mobile Body

The technology (present technology) according to the present disclosure is applicable to various products. For example, the technology according to the present disclosure may be realized as a device which is mounted on a mobile body of such a type as an automobile, an electric automobile, a hybrid electric automobile, a motorcycle, a bicycle, a personal mobility, an aircraft, a drone, a ship, or a robot.

Figure 25:
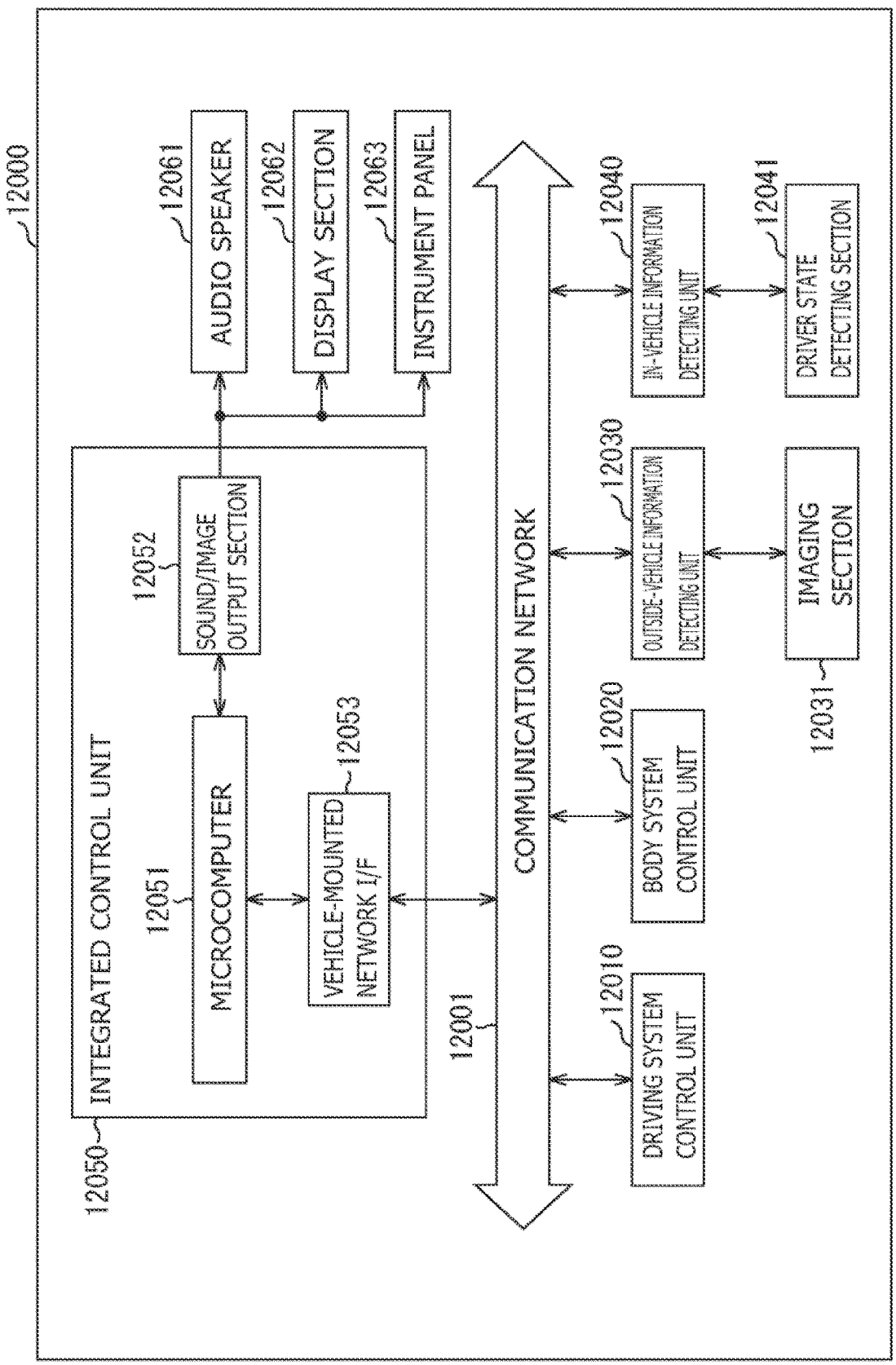
FIG. 25 is a block diagram depicting an example of schematic configuration of a vehicle control system.

FIG. 25 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 25, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 25, an audio speaker 12061, a display section 12062, and an instrument panel 12063 are illustrated as the output device. The display section 12062 may, for example, include at least one of an on-board display and a head-up display.

Figure 26:
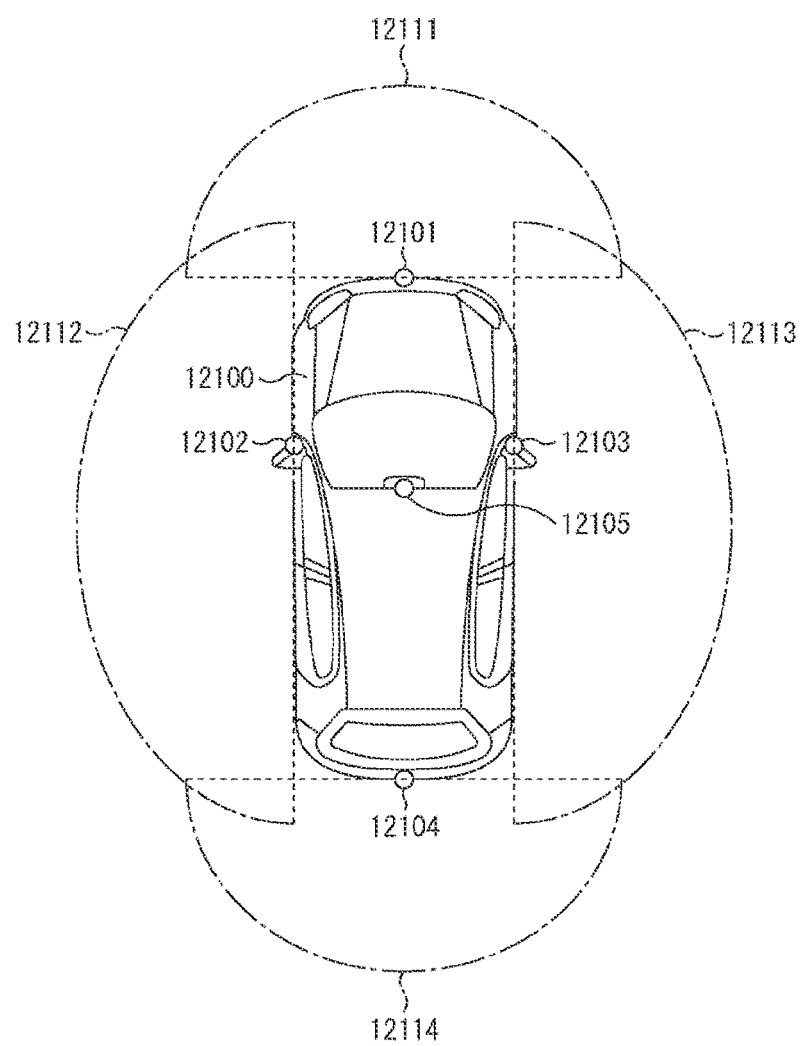
FIG. 26 is a diagram of assistance in explaining an example of installation positions of an outside-vehicle information detecting section and an imaging section.

FIG. 26 is a diagram depicting an example of the installation position of the imaging section 12031.

In FIG. 26, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 26 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure can be applied has been explained above. The technology according to the present disclosure can be applied to the imaging section 12031 in the abovementioned configuration, for example. Specifically, the imaging device 100 in FIG. 1 can be applied to the imaging section 12031. When the technology according to the present disclosure is applied to the imaging section 12031, power consumption of the imaging section 12031 can be reduced. Accordingly, power consumption of the entire system can be reduced.

It is to be noted that each of the above embodiments exemplifies one example for realizing the present technology. The features in the embodiments have correspondence with the respective invention-specifying matters in the claims. Similarly, the invention-specifying matters in the claims have correspondence with matters having the same names in the embodiments of the present technology. However, the present technology is not limited to the embodiments, and various modifications of the embodiments can be made within the gist of the present technology such that the present technology can be realized.

It is to be noted that the present technology may also have the following configurations.

(1)

A solid-state imaging element including:

a pixel section that outputs a pixel signal based on a light amount of incident light;

a reference signal supply section that generates a first reference signal and a second reference signal;

a comparison section that includes a first differential pair transistor to which the pixel signal and a signal based on the first reference signal are inputted and a second differential pair transistor to which the second reference signal is inputted; and a counter section that performs counting on the basis of a signal from the comparison section.

(2)

The solid-state imaging element according to (1), in which the comparison section further includes an input-side voltage division circuit that supplies, as a comparison target signal, a signal obtained by dividing a voltage difference between the first reference signal and the pixel signal to the first differential pair transistor, and a differential amplifier including the first and second differential pair transistors amplifies a difference between the comparison target signal and the second reference signal and outputs the resultant signal as the comparison result to the counter section.

(3)

The solid-state imaging element according to (2), in which the comparison section further includes a reference-side voltage division circuit that supplies a signal obtained by dividing a voltage difference between the second reference signal and a predetermined fixed potential to the second differential pair transistor, and the differential amplifier amplifies a difference between the comparison target signal and the signal obtained by voltage division at the reference-side voltage division circuit.

(4)

The solid-state imaging element according to (2) or (3), in which the comparison section further includes an output amplifier that amplifies the comparison result and outputs the result to the counter.

(5)

The solid-state imaging element according to (4), in which the comparison section further includes an amplitude restricting section that restricts an amplitude of the comparison result and supplies the result to the output amplifier.

(6)

The solid-state imaging element according to (5), in which the amplitude restricting section includes a pair of bias voltage supply sections that supply bias voltages different from each other, and a pair of diodes that are interposed in series between the pair of bias voltage supply sections, and an output terminal of the differential amplifier and an input terminal of the output amplifier are connected in common to a connection point between the pair of diodes.

(7)

The solid-state imaging element according to (5), in which
the amplitude restricting section includes
a P-type transistor and an N-type transistor that are connected in series, and
a pair of bias voltage supply sections that supply bias voltages different from each other to respective gates of the P-type transistor and the N-type transistor, and
an output terminal of the differential amplifier and an input terminal of the output amplifier are connected in common to a connection point between the P-type transistor and the N-type transistor.

(8)

The solid-state imaging element according to (5), in which
the amplitude restricting section includes
a power source-side current source that is connected to a power source terminal,
a gate-grounded transistor having a source one end of which is connected to the power source-side current source and a drain one end of which is connected to the power source-side current source,
a bias voltage supply section that supplies a predetermined bias voltage to a gate of the gate-grounded transistor, and
a ground-side current source that is interposed between a ground terminal and other ends of the source and the drain of the gate-grounded transistor, and
a connection point between either one of the power source-side current source and the ground-side current source and the source of the gate-grounded transistor is connected to the output terminal of the differential amplifier, and a connection point between the other one of the power source-side current source and the ground-side current source and the drain of the gate-grounded transistor is connected to the input terminal of the output amplifier.

(9)

The solid-state imaging element according to (8), in which
the amplitude restricting section further includes
an input-side switch that opens/closes a path between the output terminal of the differential amplifier and the connection point between either one of the power source-side current source and the ground-side current source and the source of the gate-grounded transistor, and
an output-side switch that opens/closes a path between the ground terminal and the connection point between the other one of the power source-side current source and the ground-side current source and the drain of the gate-grounded transistor, and
in a case where one of the input-side switch and the output-side switch enters an open state, the other switch is shifted to a closed state.

(10)

The solid-state imaging element according to any one of (1) to (9), in which
the reference signal supply section includes
plural selection circuits from each of which a predetermined current is outputted from either one of first and second output terminals according to a predetermined selection signal,
a first resistor having one end connected in common to the respective first output terminals of the plurality of selection circuits, and
a second resistor having one end connected in common to the respective second output terminals of the plurality of selection circuits, and
the first reference signal is outputted from the one end of the first resistor, and the second reference signal is outputted from the one end of the second resistor.

(11)

The solid-state imaging element according to (10), in which
the selection circuits each include
a current source that supplies the predetermined current,
first and second selection transistors that are connected in common to the current source,
an inverter that inverts the selection signal and supplies the inverted selection signal to a gate of either one of the first and second selection transistors,
a first cascode transistor that is interposed in series between the first selection transistor and the first output terminal, and
a second cascode transistor that is interposed in series between the second selection transistor and the second output terminal, and
the selection signal is inputted to a gate of the other one of the first and second selection transistors, and a predetermined bias voltage is applied to respective gates of the first and second cascode transistors.

(12)

The solid-state imaging element according to any one of (1) to (11), further including:
a pixel that generates the input signal by photoelectric conversion, in which
the pixel is disposed on a predetermined light receiving board, and
the reference signal supply section, the comparison section, and the counter section are disposed on a predetermined circuit board that is layered on the light receiving board.

(13)

An imaging device including:
a pixel section that outputs a pixel signal based on a light amount of incident light;
a reference signal supply section that generates a first reference signal and a second reference signal;
a comparison section that includes a first differential pair transistor to which the pixel signal and a signal based on the first reference signal are inputted and a second differential pair transistor to which the second reference signal is inputted;
a counter section that performs counting on the basis of a signal from the comparison section; and
a signal processing section that processes a digital signal indicating a count value of the counter section.

(14)

A method for controlling a solid-state imaging element, the method including:
a reference signal supplying procedure of generating a first reference signal and a second reference signal;
a comparison procedure of including a first differential pair transistor to which a pixel signal based on a light amount of incident light and a signal based on the first reference signal are inputted and a second differential pair transistor to which the second reference signal is inputted; and
a counter procedure of performing counting on the basis of a signal generated by the comparison procedure.

REFERENCE SIGNS LIST

100 Imaging device
110 Optical section

120 DSP circuit
130 Display section
140 Operation section
150 Bus
160 Frame memory
170 Storage section
180 Power source section
200 Solid-state imaging element
201 Light receiving board
202 Circuit board
210 Row selection section
220 Timing control section
230 DAC
231, 232, 233 Resistor
234 Fixed voltage generating section
240 Selection circuit
241 Current source
242, 337, 337-1, 352, 354, 364 Current source transistor
243, 245, 343 Switch
244, 246 Selection transistor
247 Inverter
248, 249 Cascode transistor
250 Pixel array section
251 Pixel
260 Column signal processing section
261 Constant current source circuit
262 Constant current source
270 Horizontal transfer scanning section
300 AD conversion section
310 ADC
320 Comparator
321, 322, 323, 324, 338, 344 Capacitor
330 Differential amplifier
331, 332, 335-1, 336-1, 341, 362, 363, 382 P-type transistor
333 to 336, 331-1, 332-2, 342, 381 N-type transistor
340 Output amplifier
350, 360, 370, 380 Amplitude restricting section
351, 371, 372, 383, 384 Bias voltage supply section
353 Gate-grounded transistor
361, 365 Switch transistor
373, 374 Diode
390 Counter
395 Latch circuit
12031 Imaging section

The invention claimed is:
1. A solid-state imaging element, comprising:
a pixel section configured to:
  receive incident light; and
  output a pixel signal based on a light amount of the incident light;
a reference signal supply section configured to generate a first reference signal and a second reference signal;
a comparison section that includes:
  a first differential pair transistors;
  an input-side voltage division circuit configured to:
    divide a voltage difference between the pixel signal and the first reference signal to obtain a comparison target signal; and
    supply the comparison target signal to the first differential pair transistor, wherein the first differential pair transistor is configured to receive the comparison target signal; and
  a second differential pair transistor configured to receive the second reference signal, wherein the comparison section is configured to:
    compare the comparison target signal and the second reference signal to obtain a comparison result; and
    output the comparison result; and
  a counter section configured to execute a counting operation based on the comparison result output from the comparison section.
2. The solid-state imaging element according to claim 1, wherein the comparison section further includes a differential amplifier that includes the first differential pair transistor and the second differential pair transistor, wherein the differential amplifier is configured to:
  amplify a difference between the comparison target signal and the second reference signal to generate a first amplified signal; and
  output the first amplified signal as the comparison result to the counter section.
3. The solid-state imaging element according to claim 2, wherein
  the comparison section further includes a reference-side voltage division circuit,
  the reference-side voltage division circuit is configured to:
    divide a voltage difference between the second reference signal and a fixed potential to obtain a specific signal; and
    supply the specific signal to the second differential pair transistor, and
  the differential amplifier is further configured to amplify a difference between the comparison target signal and the specific signal.
4. The solid-state imaging element according to claim 2, wherein
  the comparison section further includes an output amplifier, and
  the output amplifier is configured to:
    amplify the comparison result to generate a second amplified signal; and
    output the second amplified signal to the counter section.
5. The solid-state imaging element according to claim 4, wherein
  the comparison section further includes an amplitude restricting section, and
  the amplitude restricting section is configured to:
    restrict an amplitude of the comparison result to generate a specific signal; and
    supply the specific signal to the output amplifier.
6. The solid-state imaging element according to claim 5, wherein
  the amplitude restricting section includes:
    a pair of bias voltage supply sections that includes:
      a first bias voltage supply section configured to supply a first bias voltage; and
      a second bias voltage supply section configured to supply a second bias voltage different from the first bias voltage; and
    a pair of diodes interposed in series between the pair of bias voltage supply sections, and
  an output terminal of the differential amplifier and an input terminal of the output amplifier are connected in common to a connection point between the pair of diodes.
7. The solid-state imaging element according to claim 5, wherein
  the amplitude restricting section includes:
    a P-type transistor; and
    an N-type transistor connected in series with the P-type transistor; and a pair of bias voltage supply sections that includes:
a first bias voltage supply section configured to supply a first bias voltage to a gate of the P-type transistor; and
a second bias voltage supply section configured to supply a second bias voltage to a gate of the N-type transistor, wherein the second bias voltage is different from the first bias voltage, and
an output terminal of the differential amplifier and an input terminal of the output amplifier are connected in common to a connection point between the P-type transistor and the N-type transistor.

8. The solid-state imaging element according to claim 5, wherein
the amplitude restricting section includes:
a power source-side current source that is connected to a power source terminal;
a gate-grounded transistor that includes:
a source connected to the power source-side current source; and
a drain connected to the power source-side current source,
a bias voltage supply section configured to supply a bias voltage to a gate of the gate-grounded transistor, and
a ground-side current source that is interposed between a ground terminal and other ends of the source and the drain of the gate-grounded transistor,
a first connection point between the source of the gate-grounded transistor and one of the power source-side current source or the ground-side current source is connected to an output terminal of the differential amplifier, and
a second connection point between the drain of the gate-grounded transistor and other one of the power source-side current source or the ground-side current source is connected to an input terminal of the output amplifier.

9. The solid-state imaging element according to claim 8, wherein
the amplitude restricting section further includes:
an input-side switch configured to one of open or close a path between the output terminal of the differential amplifier and the first connection point; and
an output-side switch configured to one of open or close a path between the ground terminal and the second connection point, and
in a case where one of the input-side switch or the output-side switch enters an open state, other of the one of the input-side switch or the output-side switch is configured to shift to a closed state.

10. The solid-state imaging element according to claim 1, wherein
the reference signal supply section includes:
a plurality of selection circuits that includes a plurality of first output terminals and a plurality of second output terminals, wherein
each selection circuit of the plurality of selection circuits corresponds to a respective first output terminal of the plurality of first output terminals and a respective second output terminal of the plurality of second output terminals, and
each selection circuit of the plurality of selection circuits is configured to output, based on a selection signal, a determined current from one of the respective first output terminal or the respective second output terminal;

a first resistor that includes an end connected in common to the plurality of first output terminals of the plurality of selection circuits; and
a second resistor that includes an one end connected in common to the plurality of second output terminals of the plurality of selection circuits,
the first resistor is configured to output first reference signal from the end of the first resistor, and
the second resistor is configured to output the second reference signal from the end of the second resistor.

11. The solid-state imaging element according to claim 10, wherein
each selection circuit of the plurality of selection circuits includes:
a current source configured to supply that supplies the determined current;
a first selection transistor and a second selection transistor that are connected in common to the current source;
an inverter configured to:
invert the selection signal; and
supply the inverted selection signal to a gate of one of the first selection transistor or the second selection transistor;
a first cascode transistor interposed in series between the first selection transistor and the respective first output terminal; and
a second cascode transistor interposed in series between the second selection transistor and the respective second output terminal,
a gate of other of the one of the first selection transistor or the second selection transistor is configured to receive the selection signal, and
each of a gate of the first cascode transistor and a gate of the second cascode transistor is configured to receive a determined bias voltage.

12. The solid-state imaging element according to claim 1, further comprising:
a pixel configured to generate the pixel signal by photoelectric conversion, wherein
the pixel is on a light receiving board,
the reference signal supply section, the comparison section, and the counter section are on a circuit board, and
the circuit board is on the light receiving board.

13. An imaging device, comprising:
a pixel section configured to:
receive incident light; and
output a pixel signal based on a light amount of the incident light;
a reference signal supply section configured to generate a first reference signal and a second reference signal;
a comparison section that includes:
a first differential pair transistor;
an input-side voltage division circuit configured to:
divide a voltage difference between the pixel signal and the first reference signal to obtain a comparison target signal; and
supply the comparison target signal to the first differential pair transistor, wherein the first differential pair transistor is configured to receive the comparison target signal; and a second differential pair transistor configured to receive the second reference signal, wherein the comparison section is configured to:
compare the comparison target signal and the second reference signal to obtain a comparison result; and
output the comparison result;
a counter section configured to execute a counting operation based on the comparison result output from the comparison section; and
a signal processing section configured to process a digital signal that indicates a count value of the counter section.

14. A method for controlling a solid-state imaging element, the method comprising:
generating a first reference signal and a second reference signal;
dividing a voltage difference between a pixel signal and the first reference signal to obtain a comparison target signal;
receiving, by a first differential pair transistor, the comparison target signal;
receiving, by a second differential pair transistor, the second reference signal;
comparing the comparison target signal and the second reference signal to obtain a comparison result; and
executing a counting operation based on the comparison result.

15. A solid-state imaging element, comprising:
a pixel section configured to:
receive incident light; and
output a pixel signal based on a light amount of the incident light;
a reference signal supply section configured to generate a first reference signal and a second reference signal;
a comparison section that includes:
a differential amplifier that includes a first differential pair transistor and a second differential pair transistor; and
an input-side voltage division circuit configured to:
divide a voltage difference between the pixel signal and the first reference signal to obtain a comparison target signal; and
supply the comparison target signal to the first differential pair transistor, wherein
the first differential pair transistor is configured to receive the comparison target signal,
the second differential pair transistor is configured to receive the second reference signal, and
the differential amplifier is configured to:
amplify a difference between the comparison target signal and the second reference signal to generate an amplified signal; and
output the amplified signal as a comparison result; and
a counter section configured to execute a counting operation based on the comparison result.

* * * * *